(12) United States Patent
Nishi

(10) Patent No.: US 11,206,353 B2
(45) Date of Patent: Dec. 21, 2021

(54) ELECTRONIC APPARATUS, METHOD FOR CONTROLLING ELECTRONIC APPARATUS, AND CONTROL PROGRAM FOR SETTING IMAGE-CAPTURE CONDITIONS OF IMAGE SENSOR

(71) Applicant: NIKON CORPORATION, Tokyo (JP)

(72) Inventor: Takeshi Nishi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/587,736

(22) Filed: Sep. 30, 2019

(65) Prior Publication Data
US 2020/0029022 A1 Jan. 23, 2020

Related U.S. Application Data

(63) Continuation of application No. 15/873,291, filed on Jan. 17, 2018, now Pat. No. 10,469,756, which is a (Continued)

(51) Int. Cl.
  *H04N 5/232* (2006.01)
  *H04N 5/341* (2011.01)
  (Continued)

(52) U.S. Cl.
  CPC ... *H04N 5/23293* (2013.01); *H01L 27/14621* (2013.01); *H01L 27/14627* (2013.01);
  (Continued)

(58) Field of Classification Search
  CPC .. H04N 5/23293; H04N 5/3745; H04N 5/369; H04N 5/341; H04N 5/23245
  See application file for complete search history.

(56) References Cited

U.S. PATENT DOCUMENTS 7,884,309 B2 2/2011 Olsen et al.
8,633,998 B2 1/2014 Hayashi et al.
(Continued)

FOREIGN PATENT DOCUMENTS

JP 2005-094636 A 4/2005
JP 2006-049361 A 2/2006
(Continued)

OTHER PUBLICATIONS

Nov. 26, 2019 Office Action issued in Japanese Patent Application No. 2019-057995.
(Continued)

*Primary Examiner* — Hung H Lam
(74) *Attorney, Agent, or Firm* — Oliff PLC

(57) ABSTRACT

To check image changes corresponding to changes made to image-capture conditions by causing display unit to display multiple images captured under different image-capture conditions. Digital camera includes: image-capture unit having multiple first image sensors and multiple second image sensors disposed therein, first image sensors configured to capture image under first image-capture conditions, second image sensors configured to capture image under second image-capture conditions different from first image-capture conditions, image-capture unit configured to output first image data generated based on subject image which entered first image sensors and second image data generated based on subject image which entered second image sensors; and control unit configured to display first image based on first image data and second image based on second image data on display unit in such manner that selection can be made between respective recording forms of first image data and second image data.

12 Claims, 25 Drawing Sheets

Related U.S. Application Data continuation of application No. 14/760,896, filed as application No. PCT/JP2013/076507 on Sep. 30, 2013, now Pat. No. 9,894,281.

(51) Int. Cl.

| | |
|---|---|
| *H04N 5/369* | (2011.01) |
| *H04N 5/3745* | (2011.01) |
| *H01L 27/146* | (2006.01) |
| *H04N 9/04* | (2006.01) |
| *H04N 5/374* | (2011.01) |

(52) U.S. Cl.
CPC ............ *H04N 5/341* (2013.01); *H04N 5/369* (2013.01); *H04N 5/379* (2018.08); *H04N 5/3745* (2013.01); *H04N 9/04557* (2018.08); *H04N 5/23245* (2013.01)

(56) References Cited

U.S. PATENT DOCUMENTS

| | | | |
|---|---|---|---|
| 9,143,684 | B2 | 9/2015 | Choi et al. |
| 9,933,922 | B2 | 4/2018 | Ye |
| 2003/0160886 | A1 | 8/2003 | Misawa et al. |
| 2006/0023109 | A1 | 2/2006 | Mabuchi et al. |
| 2006/0103745 | A1 | 5/2006 | Nagaishi et al. |
| 2006/0290788 | A1 | 12/2006 | Ohtsuka et al. |
| 2007/0257184 | A1* | 11/2007 | Olsen ............... H01L 27/14621 250/208.1 |
| 2008/0079839 | A1 | 4/2008 | Sung et al. |
| 2008/0140317 | A1 | 6/2008 | Fujiyoshi |
| 2008/0218611 | A1 | 9/2008 | Parulski et al. |
| 2010/0007780 | A1 | 1/2010 | Nishihara |
| 2010/0194917 | A1 | 8/2010 | Funamoto |
| 2010/0231738 | A1 | 9/2010 | Border et al. |
| 2011/0141331 | A1* | 6/2011 | Lee ..................... H04N 5/35554 348/297 |
| 2011/0149129 | A1* | 6/2011 | Kim ..................... H04N 5/2351 348/296 |
| 2012/0050565 | A1 | 3/2012 | Imai |
| 2013/0020468 | A1 | 1/2013 | Mitsuhashi et al. |
| 2013/0027575 | A1* | 1/2013 | Cho ..................... G01S 7/4863 348/222.1 |
| 2013/0070139 | A1* | 3/2013 | Kirsch ............... H04N 5/37455 348/302 |
| 2013/0300905 | A1 | 11/2013 | Mabuchi et al. |
| 2014/0104471 | A1 | 4/2014 | Mabuchi et al. |
| 2014/0164993 | A1 | 6/2014 | Chang |
| 2014/0354561 | A1 | 12/2014 | Kim et al. |
| 2015/0077590 | A1* | 3/2015 | Kuriyama .......... H04N 5/37452 348/231.99 |
| 2016/0225175 | A1 | 8/2016 | Kim et al. |

FOREIGN PATENT DOCUMENTS

| | | |
|---|---|---|
| JP | 2008-301526 A | 12/2008 |
| JP | 2009-033338 A | 2/2009 |
| JP | 2009-302946 A | 12/2009 |
| JP | 2010-056645 A | 3/2010 |
| JP | 2011-130138 A | 6/2011 |
| JP | 2012-139026 A | 7/2012 |
| JP | 2012-217215 A | 11/2012 |
| JP | 2013-015529 A | 1/2013 |

OTHER PUBLICATIONS

Oct. 15, 2018 Office Action issued in Chinese Patent Application No. 201380073725.7.
Nov. 12, 2013 Search Report issued in International Patent Application No. PCT/JP2013/076507.
Jan. 12, 2016 Office Action issued in Japanese Patent Application No. 2014-561215.
Mar. 24, 2017 Office Action Issued In U.S. Appl. No. 14/760,896.
Feb. 14, 2017 Extended Search Report issued in European Patent Application No. 13894745.2.
Oct. 6, 2015 Office Action issued in Japanese Patent Application No. 2014-561215.
Oct. 5, 2017 Notice of Allowance issued in U.S. Appl. No. 14/760,896.
Sep. 9, 2016 Requirement for Restriction/Election of Species issued in U.S. Appl. No. 14/760,896.
Jul. 12, 2018 Requirement for Restriction/Election of Species issued in U.S. Appl. No. 15/873,291.
Dec. 28, 2018 Office Action issued in U.S. Appl. No. 15/873,291.
Jun. 27, 2019 Notice of Allowance issued in U.S. Appl. No. 15/873,291.
Jul. 7, 2020 Office Action issued in Japanese Patent Application No. 2019-057995.
Sep. 14, 2020 Office Action issued in Chinese Patent Application No. 201910638428.1.

* cited by examiner

ELECTRONIC APPARATUS, METHOD FOR CONTROLLING ELECTRONIC APPARATUS, AND CONTROL PROGRAM FOR SETTING IMAGE-CAPTURE CONDITIONS OF IMAGE SENSOR

This application is a continuation of U.S. application Ser. No. 15/873,291 filed Jan. 17, 2018, which is a continuation of U.S. application Ser. No. 14/760,896 filed Jul. 14, 2015, which is a National Stage of International Patent Application No. PCT/JP2013/076507 filed on Sep. 30, 2013. The entire contents of the above applications are incorporated herein by reference.

TECHNICAL FIELD

The present invention relates to an electronic apparatus, a method for controlling an electronic apparatus, and a control program.

BACKGROUND ART

Electronic apparatuses each including an image sensor in which a back-illuminated image-capture chip and a signal processing chip are stacked (hereafter referred to as a stacked image sensor) have been proposed (for example, see Patent Literature 1). In a stacked image sensor, a back-illuminated image-capture chip and a signal processing chip are stacked so as to be connected via micro-bumps corresponding to blocks each including multiple pixels.

PRIOR ART LITERATURE

Patent Literature

[Patent Literature 1] Japanese Unexamined Patent Application Publication No. 2006-49361

SUMMARY OF INVENTION

Technical Problem

However, there have been proposed only a few electronic apparatuses including a stacked image sensor configured to capture an image on a multiple-block basis. Accordingly, the usability of electronic apparatuses including a stacked image sensor has not been sufficiently improved.

An object of an aspect of the present invention is to check changes in images corresponding to changes made to image-capture conditions by causing a display unit to display multiple images captured under different image-capture conditions.

Solution to Problem

A first aspect of the present invention provides an electronic apparatus. The electronic apparatus includes: an image-capture unit having multiple first image sensors and multiple second image sensors disposed therein, the first image sensors being configured to capture an image under first image-capture conditions, the second image sensors being configured to capture an image under second image-capture conditions different from the first image-capture conditions, the image-capture unit being configured to output first image data generated based on a subject image which has entered the first image sensors and second image data generated based on a subject image that has entered the second image sensors; and a control unit configured to display a first image based on the first image data and a second image based on the second image data on a display unit in such a manner that a selection can be made between respective recording forms of the first image data and second image data.

A second aspect of the present invention provides a method for controlling an electronic apparatus. The electronic apparatus includes an image-capture unit having multiple first image sensors and multiple second image sensors disposed therein, the first image sensors being configured to capture an image under first image-capture conditions, the second image sensors being configured to capture an image under second image-capture conditions different from the first image-capture conditions, the image-capture unit being configured to output first image data generated based on a subject image which has entered the first image sensors and second image data generated based on a subject image that has entered the second image sensors. The method includes displaying a first image based on the first image data and a second image based on the second image data on a display unit in such a manner that a selection can be made between respective recording forms of the first image data and second image data.

A third aspect of the present invention provides a control program for causing a control device of an electronic apparatus to perform a process. The electronic apparatus includes an image-capture unit having multiple first image sensors and multiple second image sensors disposed therein, the first image sensors being configured to capture an image under first image-capture conditions, the second image sensors being configured to capture an image under second image-capture conditions different from the first image-capture conditions, the image-capture unit being configured to output first image data generated based on a subject image which has entered the first image sensors and second image data generated based on a subject image that has entered the second image sensors. The control program causes the control device to display a first image based on the first image data and a second image based on the second image data on a display unit in such a manner that a selection can be made between respective recording forms of the first image data and second image data.

Advantageous Effects of Invention

According to the aspects of the present invention, it is possible to check changes in images corresponding to changes made to image-capture conditions by causing a display unit to display multiple images captured under different image-capture conditions.

EMBODIMENTS OF THE INVENTION

Hereafter, embodiments of the present invention will be described with reference to the drawings. However, the present invention is not limited thereto. To clarify the embodiments, the drawings may be scaled as appropriate, for example, partially enlarged or highlighted. The embodiments will be described using a lens-interchangeable digital camera as an example of an electronic apparatus.

First Embodiment

Figure 1:
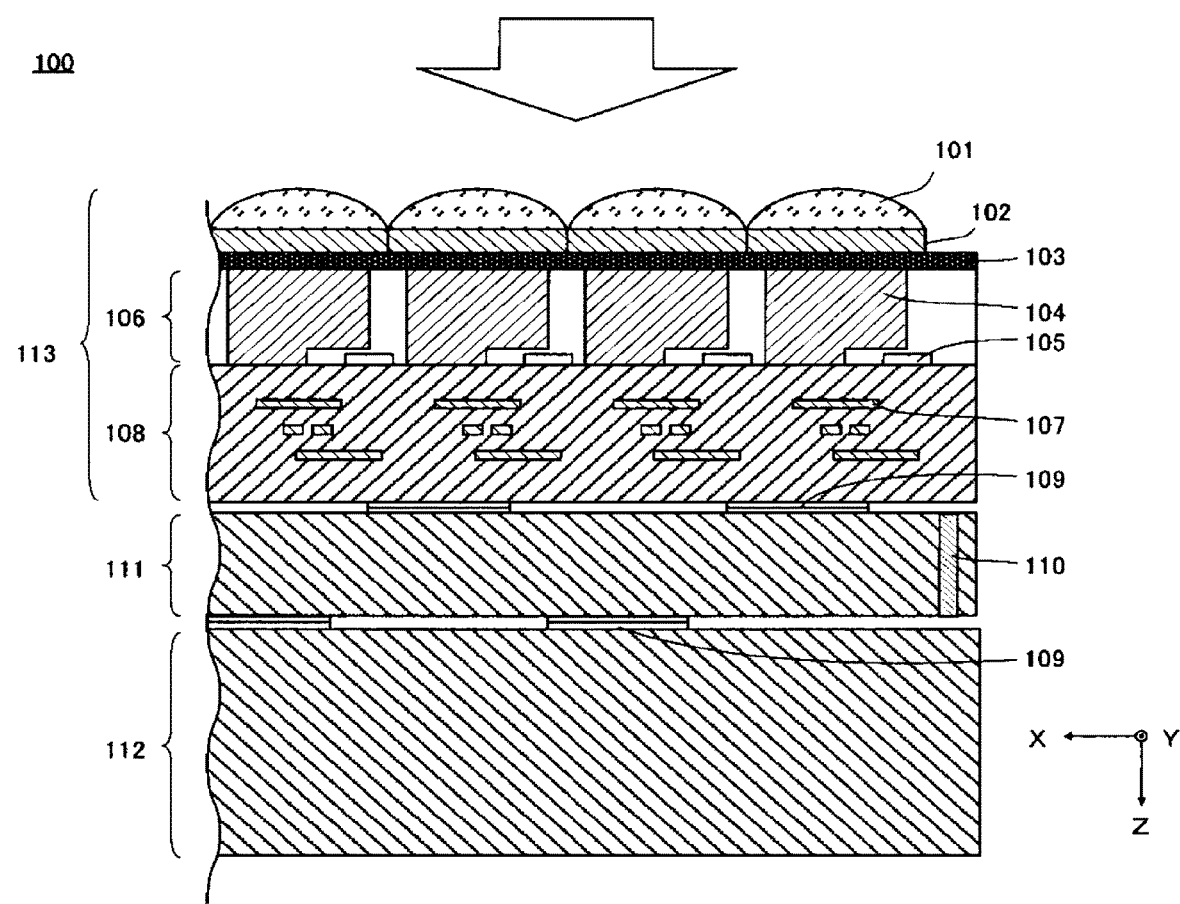
FIG. 1 is a sectional view of an image sensor of the present embodiment.

FIG. 1 is a sectional view of an image sensor 100 of the present embodiment. The image sensor 100 is disclosed in Japanese Patent Application No. 2012-139026 previously filed by the present applicant. The image sensor 100 includes an image-capture chip 113 configured to output a pixel signal corresponding to incident light, a signal processing chip 111 configured to process the pixel signal outputted from the image-capture chip 113, and a memory chip 112 configured to store the pixel signal processed by the signal processing chip 111. The image-capture chip 113, signal processing chip 111, and memory chip 112 are stacked. The image-capture chip 113 and signal processing chip 111 are electrically connected to each other via conductive bumps 109 such as Cu, and the signal processing chip 111 and memory chip 112 are also electrically connected to each other via conductive bumps 109 such as Cu.

As indicated by a coordinate axis shown in FIG. 1, incident light enters the image sensor 100 mostly in a positive z-axis direction. In the present embodiment, the incident light entry surface of the image-capture chip 113 is referred to as the back surface. Further, as indicated by another coordinate axis, the direction which is perpendicular to the z-axis and oriented to the left side of the drawing is referred to as a positive x-axis direction, and the direction which is perpendicular to the z- and x-axes and oriented to the viewer is referred to as a positive y-axis direction. In the following some drawings, coordinate axes are shown using the coordinate axes in FIG. 1 as a reference so that the orientations of such drawings are understood.

One example of the image-capture chip 113 is a back-illuminated MOS image sensor. A PD layer 106 is disposed on the back surface of a wiring layer 108. The PD layer 106 includes multiple photodiodes (PDs) 104 disposed two-dimensionally and configured to accumulate charge corresponding to incident light and transistors 105 disposed in a manner corresponding to the PDs 104.

Color filters 102 are disposed over the incident light entry surface of the PD layer 106 with a passivation film 103 therebetween. The color filters 102 are each a filter which transmits a particular wavelength range of visible light, that is, the color filters 102 include multiple color filters having different transmission wavelength ranges and are arranged in a particular manner so as to correspond to the PDs 104. The arrangement of the color filters 102 will be described later. A set of a color filter 102, a PD 104, and a transistor 105 forms one pixel.

Microlenses 101 are disposed on the incident light entry sides of the color filters 102 in a manner corresponding to the respective pixels. The microlenses 101 condense incident light toward the corresponding PDs 104.

The wiring layer 108 includes lines 107 configured to transmit pixel signals from the PD layer 106 to the signal processing chip 111. The lines 107 may be multilayered and may include passive and active elements. Multiple bumps 109 are disposed on the front surface of the wiring layer 108 and aligned with multiple bumps 109 disposed on the opposite surface of the signal processing chip 111. The aligned bumps 109 are bonded together and electrically connected together, for example, by pressurizing the image-capture chip 113 and signal processing chip 111.

Similarly, multiple bumps 109 are disposed on the opposite surfaces of the signal processing chip 111 and memory chip 112 and aligned with each other. The aligned bumps 109 are bonded together and electrically connected together, for example, by pressurizing the signal processing chip 111 and memory chip 112.

The methods for bonding the bumps 109 together include Cu bump bonding using solid phase diffusion, as well as micro-bump bonding using solder melting. For the bumps 109, it is only necessary to provide, for example, one bump or so with respect to one unit group (to be discussed later). Accordingly, the size of the bumps 109 may be larger than the pitch between the PDs 104. Further, bumps which are larger than the bumps 109 corresponding to a pixel region having the pixels arranged therein (a pixel region 113A shown in FIG. 2) may be additionally provided in peripheral regions other than the pixel region.

The signal processing chip 111 includes a through-silicon via (TSV) 110 configured to connect together circuits disposed on the front and back surfaces thereof. The TSV 110 is disposed in a peripheral region.

Alternatively, the TSV 110 may be disposed in a peripheral region of the image-capture chip 113 or in the memory chip 112.

Figure 2:
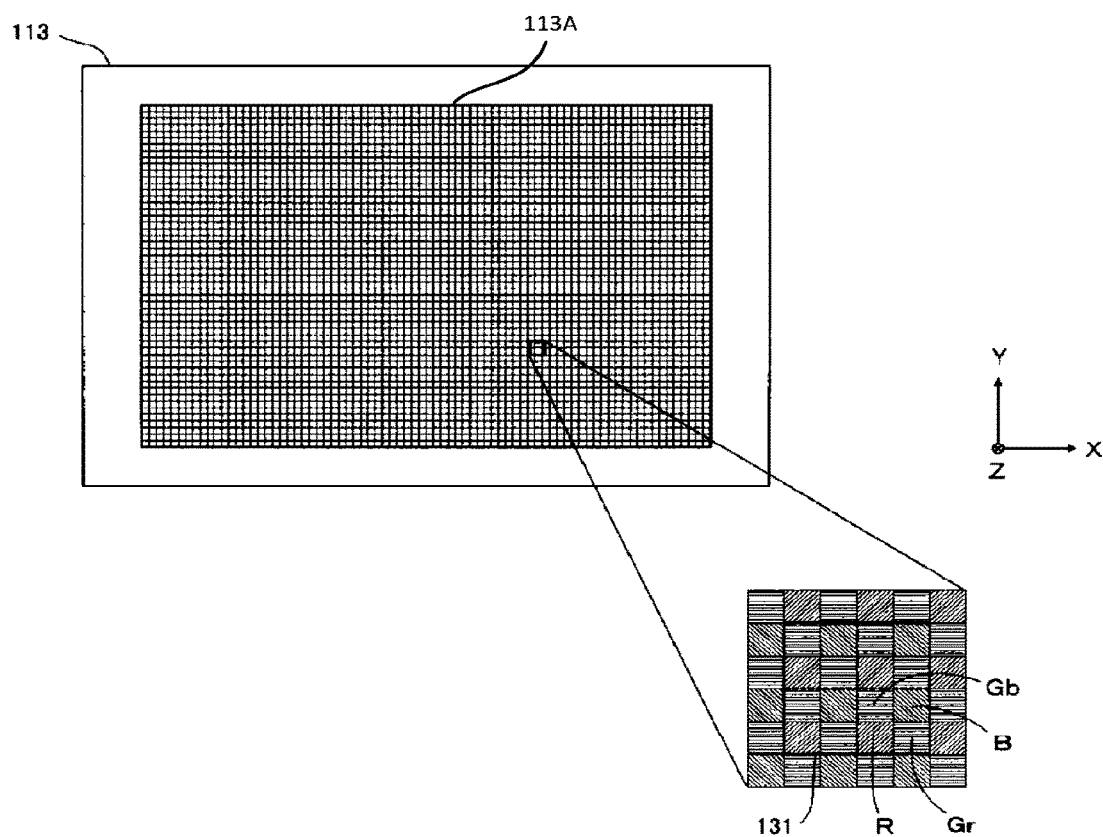
FIG. 2 is a diagram showing the pixel array of an image-capture chip and a unit group.

FIG. 2 is a diagram showing the pixel array of the image-capture chip 113 and a unit group. In FIG. 2, the image-capture chip 113 is observed from the back side. The pixel region 113A is the pixel-arranged region (image-capture region) of the image-capture chip 113. In the pixel region 113A, 20 million or more pixels are arranged in a matrix. In an example shown in FIG. 2, four adjacent pixels×four adjacent pixels, that is, 16 pixels form one unit group 131. Grid lines in FIG. 2 show a concept that adjacent pixels are grouped into unit groups 131. The number of pixels forming the unit groups 131 is not limited to that described above and may be on the order of 1000, for example, 32 pixels×64 pixels, or may be 1000 or more or less than 1000.

As shown in a partial enlarged view of the pixel region 113A, one unit group 131 includes four so-called Bayer arrays which each includes four pixels, that is, green pixels Gb, Gr, a blue pixel B, and a red pixel R and which are arranged vertically and horizontally. The green pixels are each a pixel having a green filter as a color filter 102 and receive the green-wavelength-band light of incident light. Similarly, the blue pixel is a pixel having a blue filter as a color filter 102 and receives the blue-wavelength-band light. The red pixel is a pixel having a red filter as a color filter 102 and receives the red-wavelength-band light.

Figure 3:
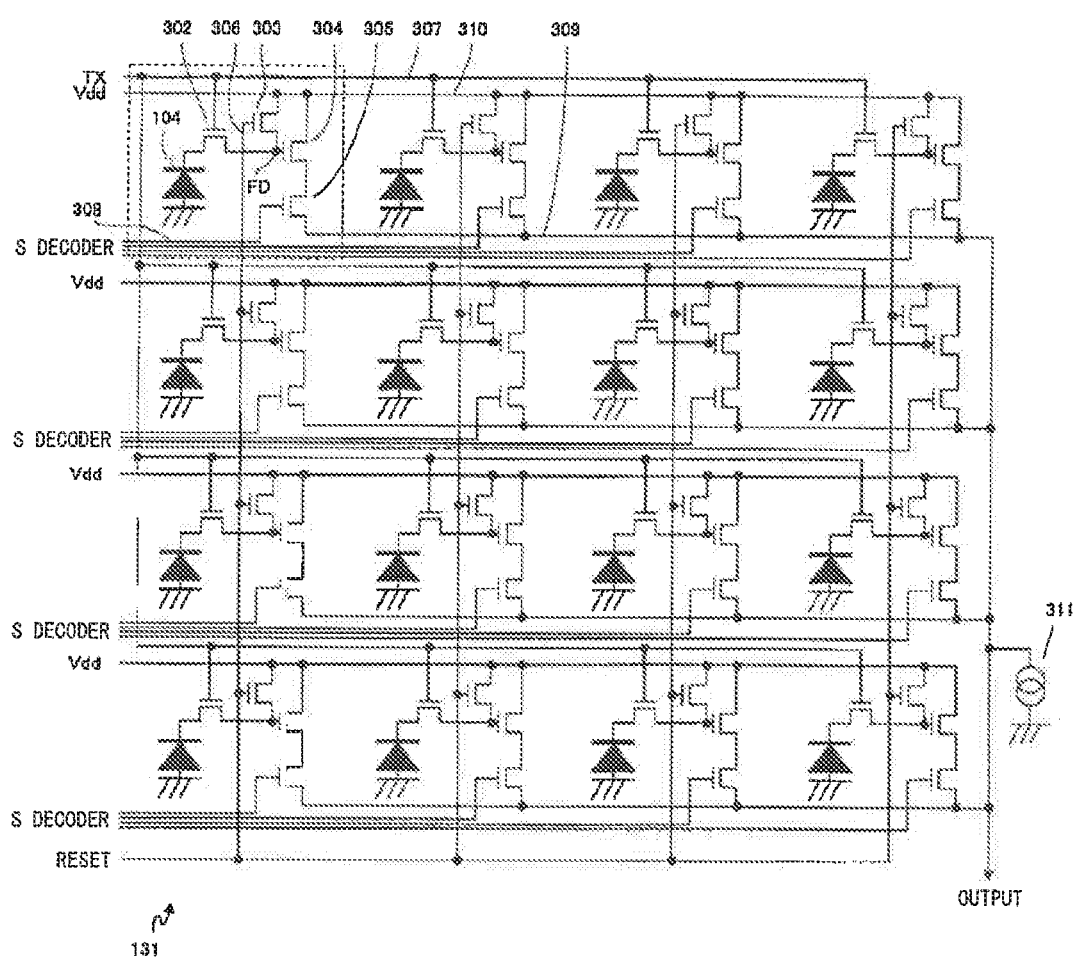
FIG. 3 is a circuit diagram of a unit group of the image-capture chip.

FIG. 3 is a circuit diagram of a unit group of the image-capture chip 113. In FIG. 3, a rectangle surrounded by a dotted line as a representative shows the circuit of one pixel. At least part of each transistor described below corresponds to one transistor 105 in FIG. 1.

As described above, one unit group 131 includes 16 pixels. Sixteen PDs 104 included in these pixels are connected to corresponding transfer transistors 302. The gates of the transfer transistors 302 are connected to a TX line 307 through which transfer pulses are supplied. In the present embodiment, the TX line 307 is shared by the 16 transfer transistors 302.

The drain of each transfer transistor 302 is connected to the source of a corresponding reset transistor 303, and so-called floating diffusion FD (charge detection unit) therebetween is connected to the gate of a corresponding amplifier transistor 304. The drains of the reset transistors 303 are connected to a Vdd line 310 through which power-supply voltages are supplied. The gates of the reset transistors 303 are connected to a reset line 306 through which reset pulses are supplied. In the present embodiment, the reset line 306 is shared by the 16 reset transistors 303.

The drains of the amplifier transistors 304 are connected to the Vdd line 310, through which power-supply voltages are supplied. The sources of the amplifier transistors 304 are connected to the drains of corresponding select transistors 305. The gates of the select transistors 305 are connected to corresponding decoder lines 308 through which selection pulses are supplied. In the present embodiment, the different decoder lines 308 are disposed with respect to the 16 select transistors 305. The sources of the select transistors 305 are connected to a shared output line 309. A load current source 311 supplies a current to the output line 309. That is, the output line 309 with respect to the select transistors 305 is formed by a source follower. The load current source 311 may be disposed in any of the image-capture chip 113 and signal processing chip 111.

Described below is the flow from when the accumulation of charge starts to when pixel signals are outputted after the accumulation ends. Reset pulses are applied to the reset transistors 303 through the reset line 306. Simultaneously, transfer pulses are applied to the transfer transistors 302 through the TX line 307. Thus, the potentials of the PDs 104 and floating diffusion FD are reset.

When the application of the transfer pulses is released, the PDs 104 convert received incident light into charge and accumulate it. Subsequently, when transfer pulses are applied again with reset pulses not being applied, the charge accumulated in each PD 104 is transferred to the corresponding floating diffusion FD. Thus, the potential of the floating diffusion FD is changed from the reset potential to the signal potential after the charge accumulation. When selection pulses are applied to the select transistors 305 through the decoder lines 308, the variation in the signal potential of each floating diffusion FD is transmitted to the output line 309 through the corresponding amplifier transistor 304 and select transistor 305. Based on such a circuit operation, the unit pixels output, to the output line 309, pixel signals corresponding to the reset potentials and pixel signals corresponding to the signal potentials.

In the present embodiment, as shown in FIG. 3, the reset line 306 and TX line 307 are shared by the 16 pixels forming the unit group 131. That is, reset pulses and transfer pulses are simultaneously applied to all the 16 pixels. Accordingly, all the pixels forming the unit group 131 start to accumulate charge at the same timing and end the charge accumulation at the same timing. Note that selection pulses are sequentially applied to the select transistors 305 and therefore pixel signals corresponding to the accumulated charge are selectively outputted to the output line 309. Different reset lines 306, TX lines 307, and output lines 309 are disposed for the respective unit groups 131.

By constructing the circuit on the basis of unit groups 131 as described above, the charge accumulation time can be controlled for each unit group 131. In other words, it is possible to cause the unit groups 131 to output pixel signals based on different charge accumulation times. More specifically, by causing another unit group 131 to accumulate charge several times and to output pixel signals each time while one unit group 131 is caused to accumulate charge once, it is possible to cause the unit groups 131 to output moving image frames at different frame rates.

Figure 4:
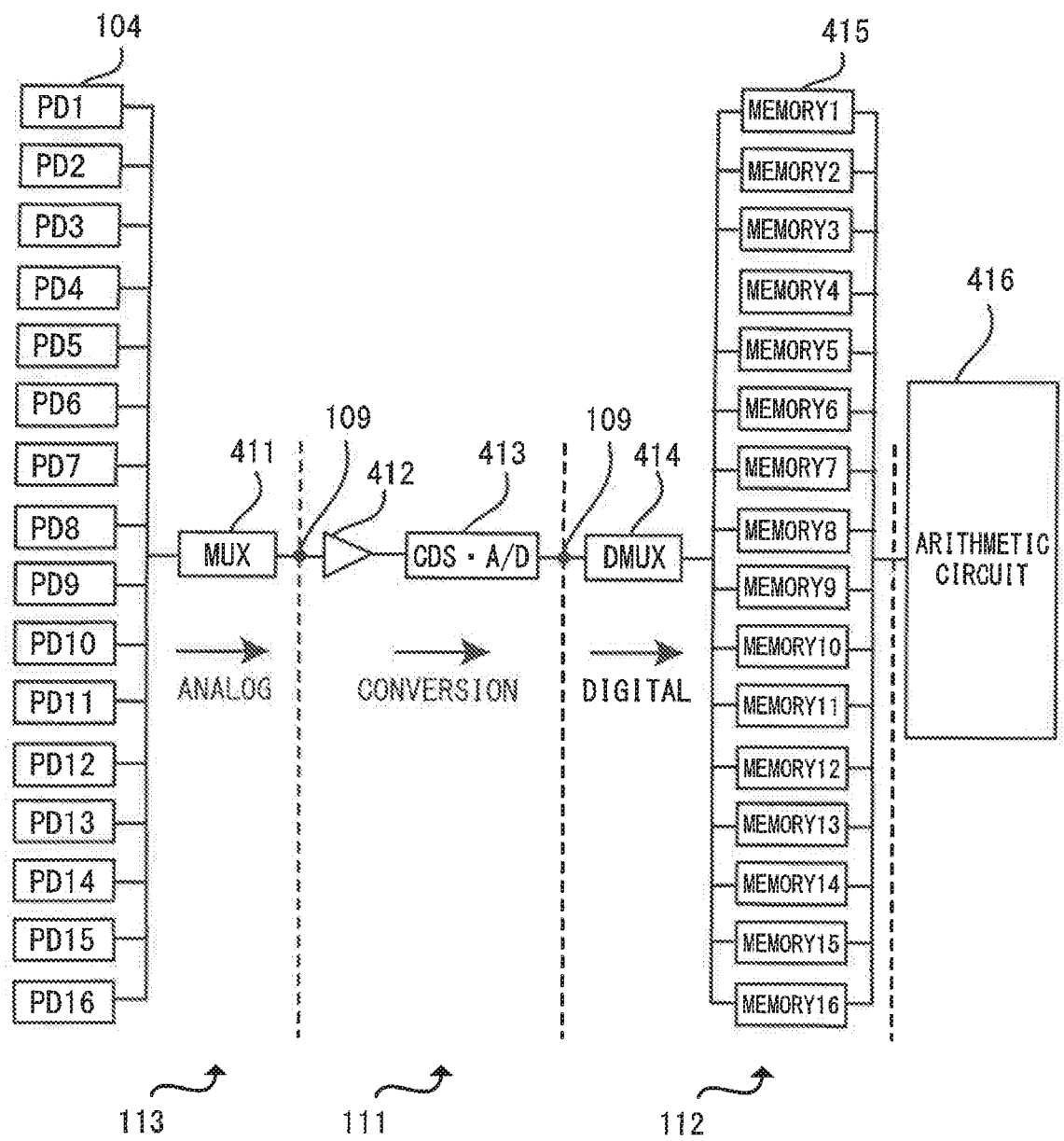
FIG. 4 is a block diagram showing the functional configuration of an image sensor.

FIG. 4 is a block diagram showing the functional configuration of the image sensor 100. An analog multiplexer 411 sequentially selects 16 PDs 104 forming one unit group 131 and causes each selected PD 104 to output a pixel signal to an output line 309 disposed in a manner corresponding to the unit group 131. The multiplexer 411 is formed along with the PDs 104 in the image-capture chip 113.

The analog pixel signals outputted through the multiplexer 411 are amplified by an amplifier 412 which is formed in the signal processing chip 111. The pixel signals amplified by the amplifier 412 are subjected to correlated double sampling (CDS) and analog-to-digital (A/D) conversion by a signal processing circuit 413 which is formed in the signal processing chip 111 and configured to perform CDS and A/D conversion. Since the pixel signals are subjected to CDS by the signal processing circuit 413, the noise in the pixel signals is reduced. The A/D-converted pixel signals are passed to a demultiplexer 414 and then stored in corresponding pixel memories 415. The demultiplexer 414 and pixel memories 415 are formed in the memory chip 112.

An arithmetic circuit 416 processes the pixel signals stored in the pixel memories 415 and passes the resulting signals to a subsequent image processing unit. The arithmetic circuit 416 may be disposed in any of the signal processing chip 111 and memory chip 112. While the elements connected to the single unit group 131 are shown in FIG. 4, these elements are disposed for each unit group 131 in practice and operate in parallel. Note that the arithmetic circuit 416 need not necessarily be disposed for each unit group 131. For example, a single arithmetic circuit 416 may sequentially refer to and process the values in the pixel memories 415 corresponding to the respective unit groups 131.

As described above, the output lines 309 are disposed in a manner corresponding to the respective unit groups 131. In the image sensor 100, the image-capture chip 113, signal processing chip 111, and memory chip 112 are stacked. Accordingly, by using, as the output lines 309, the bumps 109 electrically connecting between the chips, the lines can be routed without enlarging the chips in the surface direction.

Next, blocks set in the pixel region 113A (see FIG. 2) of the image sensor 100 will be described. In the present embodiment, the pixel region 113A of the image sensor 100 is divided into multiple blocks. Each block includes at least one unit group 131. Pixels included in the respective blocks are controlled by different control parameters. That is, the control parameters vary between pixel signals acquired from pixels included in one block and pixel signals acquired from pixels included in another block. Examples of a control parameter include the charge accumulation time or frequency, the frame rate, the gain, the thinning-out rate (pixel thinning-out rate), the number of rows or columns whose pixel signals are summed up (pixel summation count), and the digitized bit number. The control parameters may be parameters used in image processing following the acquisition of image signals from the pixels.

As used herein, the charge accumulation time refers to the time from when the PDs 104 start to accumulate charge to when they end the accumulation. The charge accumulation time is also called an exposure time or shutter speed. The charge accumulation frequency refers to the frequency with which the PDs 104 accumulate charge per unit time. The frame rate refers to the number of frames processed (displayed or recorded) per unit time in moving images. The frame rate is expressed in frames per second (fps). As the frame rate is increased, a subject (that is, an object whose image is captured) moves more smoothly in moving images.

The gain refers to the gain factor (amplification factor) of the amplifier 412. By changing the gain, the ISO sensitivity can be changed. The ISO sensitivity is a standard for photographic films developed by the ISO and represents the level of the weakest light which a photographic film can record. Typically, the sensitivity of image sensors is represented by the ISO sensitivity. In this case, the ability of the image sensor 100 to capture light is represented by an ISO sensitivity value. When the gain is increased, the ISO sensitivity is increased as well. For example, when the gain is doubled, the electrical signal (pixel signal) is doubled as well. Thus, appropriate brightness is obtained even when the amount of incident light is halved. However, increasing the gain amplifies noise included in the electric signal, thereby increasing noise.

The thinning-out rate refers to the ratio of the number of pixels from which pixel signals are not read to the total number of pixels in a predetermined region. For example, a thinning-out rate of a predetermined region of 0 means that pixel signals are read from all pixels in the predetermined region. A thinning-out rate of a predetermined region of 0.5 means that pixel signals are read from half the pixels in the predetermined region. Specifically, where a unit group 131 is a Bayer array, one Bayer array unit from which pixel signals are read and one Bayer array from which pixel signals are not read are alternately set in the vertical direction, that is, two pixels (two rows) from which pixel signals are read and two pixels (two rows) from which pixel signals are not read are alternately set in the vertical direction. On the other hand, when the pixels from which pixel signals are read are thinned out, the resolution of images is reduced. However, 20 million or more pixels are arranged in the image sensor 100 and therefore, even when the pixels are thinned out, for example, at a thinning-out rate of 0.5, an image can be displayed with 10 million or more pixels. For this reason, the user (photographer) seems not to worry about such a resolution reduction.

The number of rows whose pixel signals are summed up refers to the number of vertically adjacent pixels whose pixel signals are summed up. The number of columns whose pixel signals are summed up refers to the number of horizontally adjacent pixels whose pixel signals are summed up. Such a summation process is performed, for example, in the arithmetic circuit 416. When the arithmetic circuit 416 sums up pixel signals of a predetermined number of vertically or horizontally adjacent pixels, there is obtained an effect similar to that obtained by thinning out the pixels at a predetermined thinning-out rate and reading pixel signals from the resulting pixels. In the summation process, an average value may be calculated by dividing the sum of the pixel signals by the row number or column number obtained by the arithmetic circuit 416.

The digitized bit number refers to the number of bits of a digital signal converted from an analog signal by the signal processing circuit 413. As the number of bits of a digital signal is increased, luminance, color change, or the like is represented in more detail.

In the present embodiment, the accumulation conditions refer to conditions on the accumulation of charge in the image sensor 100. Specifically, the accumulation conditions refer to the charge accumulation time or frequency, frame rate, and gain in the control parameters. Since the frame rate can change according to the charge accumulation time or frequency, it is included in the accumulation conditions. Similarly, the correct amount of exposure can change according to the gain, and the charge accumulation time or frequency can change according to the correct amount of exposure. Accordingly, the gain is included in the accumulation conditions.

In the present embodiment, the image-capture conditions refer to conditions on image-capture of a subject. Specifically, the image-capture conditions refer to control parameters including the accumulation conditions. The image-capture conditions includes control parameters for controlling the image sensor 100 (e.g., the charge accumulation time or frequency, frame rate, gain), as well as control parameters for controlling reading of signals from the image sensor 100 (e.g., thinning-out rate, the number of rows or columns whose pixel signals are summed up) and control parameters for processing signals from the image sensor 100 (e.g., digitized bit number, and control parameters used when an image processing unit 30 (to be discussed later) performs image processing).

Figure 5:
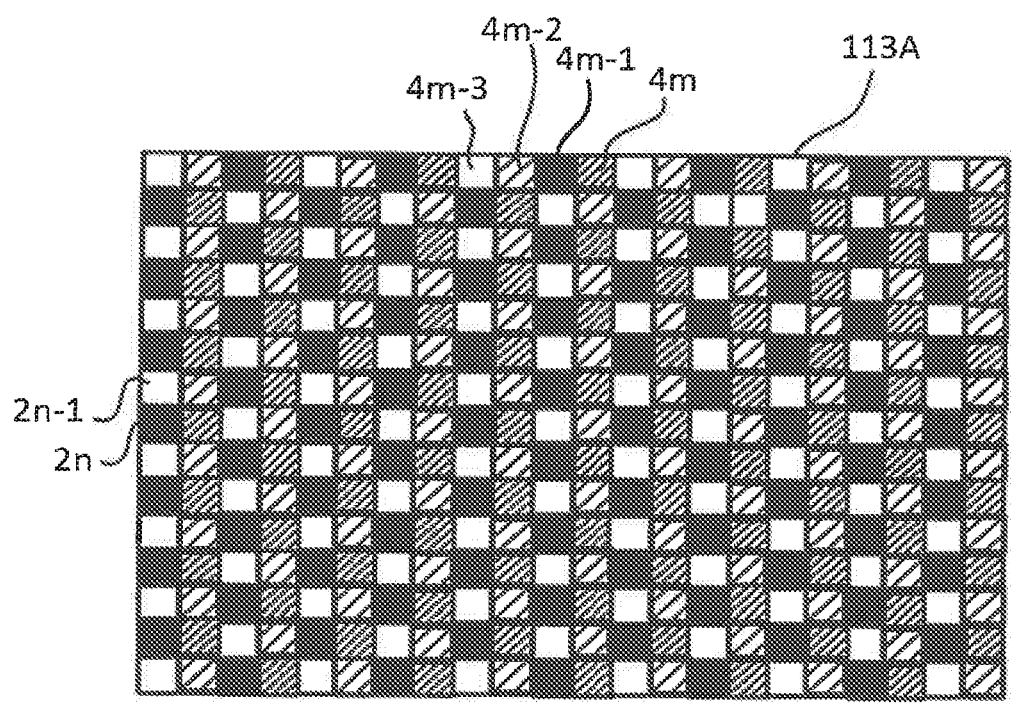
FIG. 5 is a diagram showing the arrangement pattern of blocks.

FIG. 5 is a diagram showing the arrangement pattern of blocks. In the arrangement pattern shown in FIG. 5, the pixel region 113A is divided into four image-capture regions (first to fourth image-capture regions). In the pixel region 113A, the first image-capture region includes blocks in odd rows ($2n-1$) in columns ($4m-3$), by three columns, preceding columns whose numbers are multiples of four and blocks in even rows ($2n$) in columns ($4m-1$), by one column, preceding columns whose numbers are multiples of four. The second image-capture region includes blocks in odd rows ($2n-1$) in columns ($4m-2$), by two columns, preceding columns whose numbers are multiples of four and blocks in even rows ($2n$) in columns ($4m$) whose numbers are multiples of four. The third image-capture region includes blocks in odd rows ($2n-1$) in columns ($4m-1$), by one column, preceding columns whose numbers are multiples of four and blocks in even rows ($2n$) in columns ($4m-3$), by three columns, preceding columns whose numbers are multiples of four. The fourth image-capture region includes blocks in odd rows ($2n-1$) in columns ($4m$) whose numbers are multiple of four and blocks in even rows ($2n$) in columns ($4m-2$), by two columns, preceding columns whose numbers are multiple of four. As used herein, m and n are positive integers (m=1, 2, 3, . . . ; n=1, 2, 3, . . . ).

While a small number of blocks are set in the pixel region 113A in FIG. 5 so that the arrangement of blocks of each image-capture region is easily seen, blocks in a larger number than the number of blocks shown in FIG. 5 may be set in the pixel region 113A.

According to this arrangement pattern, the first to fourth image-capture regions are arranged uniformly in the pixel region (image-capture region) 113A. Further, the first to fourth image-capture regions have the same area. Note that the first to fourth image-capture regions only have to be each arranged across the pixel region 113A. Accordingly, these image-capture regions need not necessarily be arranged uniformly in the pixel region 113A or need not necessarily have the same area.

In the arrangement pattern shown in FIG. 5, the first to fourth image-capture regions are disposed in different positions (that is, the image-capture regions are displaced from one another); therefore, different subject images enter the first to fourth image-capture regions. Accordingly, images based on sets of image data generated in the first to fourth image-capture regions are different subject images. However, the first to fourth image-capture regions are each disposed across the pixel region 113A. Accordingly, the images based on the sets of image data generated in the first to fourth image-capture regions look like the same subject image for the user.

In the present embodiment, image sensors (photoelectric conversion elements and associated circuits) disposed for the pixels in the first image-capture region are referred to as the first image sensors; image sensors disposed for the pixels in the second image-capture region as the second image sensors; image sensors disposed for the pixels in the third image-capture region as the third image sensors; and image sensors disposed for the pixels in the fourth image-capture region as the fourth image sensors. That is, the image sensor 100 is divided into the multiple first image sensors, multiple second image sensors, multiple third image sensors, and multiple fourth image sensors.

In the present embodiment, the first image sensors, second image sensors, third image sensors, and fourth image sensors capture images under different image-capture conditions. Hereafter, the image-capture conditions of the first image sensors will be referred to as the first image-capture conditions; the image-capture conditions of the second image sensors as the second image-capture conditions; the image-capture conditions of the third image sensors as third image-capture conditions; and the image-capture conditions of the fourth image sensors as the fourth image-capture conditions.

Figure 6:
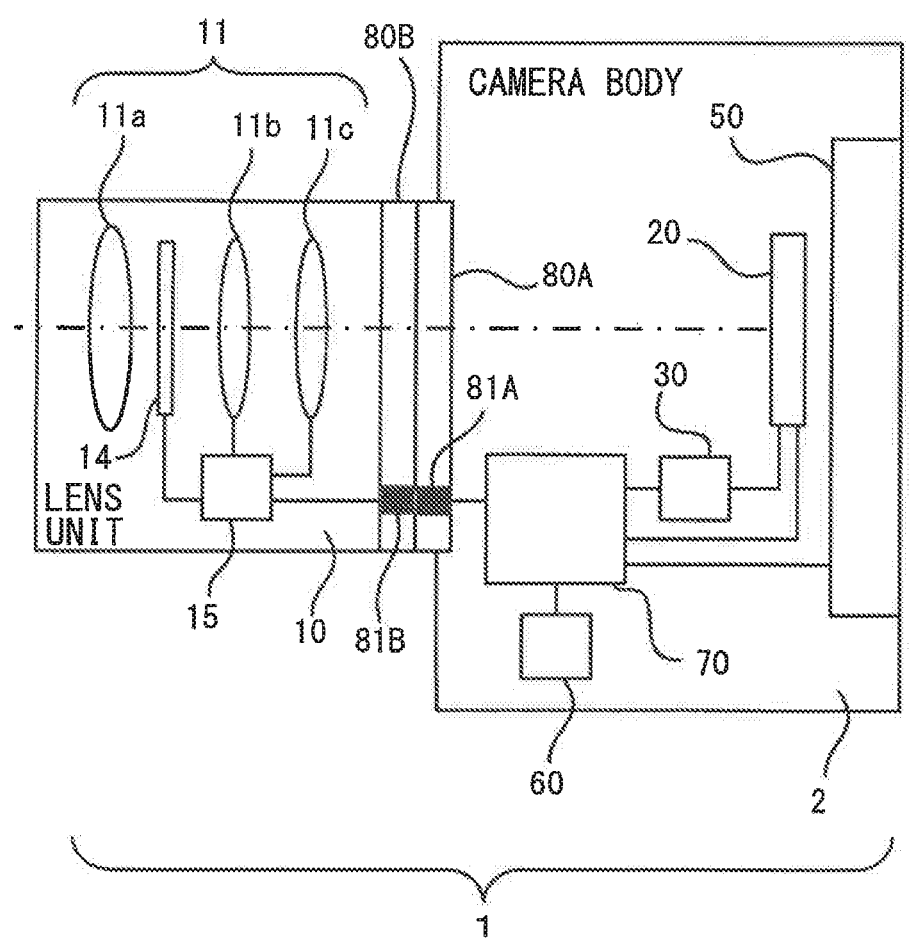
FIG. 6 is a cross-sectional view showing a schematic configuration of a digital camera which is an example of an electronic apparatus.

FIG. 6 is a cross-sectional view showing a schematic configuration of a digital camera 1, which is an example of an electronic apparatus. The digital camera 1 of the present embodiment includes a lens unit 10 and a camera body 2. The lens unit 10 is an interchangeable lens. The camera body 2 includes a body-side mounting unit 80A for mounting the lens unit 10. The lens unit 10 includes a lens-side mounting unit 80B corresponding to the body-side mounting unit 80A. When the user joins the body-side mounting unit 80A and lens-side mounting unit 80B together, the lens unit 10 is mounted on the camera body 2. Thus, an electrical contact 81A of the body-side mounting unit 80A and an electrical contact 81B of the lens-side mounting unit 80B are electrically connected together.

The lens unit 10 includes an imaging optical system 11, a diaphragm 14, and a lens drive control unit 15. The imaging optical system 11 includes a lens 11a, a zooming lens 11b, and a focusing lens 11c. The lens drive control unit 15 includes a lens-side central processing unit (CPU), a memory, and a drive control circuit. When the lens drive control unit 15 is electrically connected to the system control unit 70 in the camera body 2 through the electrical contacts 81A and 81B, it transmits lens information about the optical characteristics of the imaging optical system 11 in the lens unit 10 and receives control information for driving the zooming lens 11b, focusing lens 11c, and diaphragm 14.

The lens-side CPU of the lens drive control unit 15 causes the drive control circuit to control drive of the focusing lens 11c on the basis of control information that the system control unit 70 transmits in order to adjust the focus of the imaging optical system 11. The lens-side CPU of the lens drive control unit 15 also causes the drive control circuit to control drive of the zooming lens 11b on the basis of control information that the system control unit 70 transmits in order to adjust the zoom. The diaphragm 14 is disposed along the optical axis of the imaging optical system 11. The diaphragm 14 forms an aperture whose diameter with respect to the optical axis is variable, to adjust the amount of light and the amount of blur. The lens-side CPU of the lens drive control unit 15 causes the drive control circuit to control drive of the diaphragm 14 on the basis of control information that the system control unit 70 transmits in order to adjust the aperture diameter of the diaphragm 14.

The camera body 2 includes an image-capture unit 20, an image processing unit 30, a display unit 50, a recording unit 60, and the system control unit 70. The image-capture unit 20 includes the image sensor 100. The image sensor 100 receives light emitted by the imaging optical system 11 of the lens unit 10. The pixels of the image sensor 100 photoelectrically convert the received light into pixel signals (these pixel signals will be included in image data). The image-capture unit 20 then transmits RAW data including the pixel signals generated by the pixels (the RAW data will be also included in the image data) to the image processing unit 30. Then, the image processing unit 30 performs various types of image processing on the RAW data to generate image data in a predetermined file format (e.g., JPEG). Then, the display unit 50 displays the image data generated by the image processing unit 30. The recording unit 60 stores the image data generated by the image processing unit 30.

Hereafter, the "image data" may be referred to as the "image signal." Images include still images, moving images, and live view images. Live view images refer to images displayed on the display unit 50 based on image data sequentially generated and outputted by the image processing unit 30. The user uses live view images to check subject images that the image-capture unit 20 is capturing. Live view images are also called through images or preview images.

The system control unit 70 controls the entire processing and operation of the digital camera 1. The processing and operation of the system control unit 70 and the internal configuration of the camera body 2 will be described in detail with reference to FIG. 7.

Figure 7:
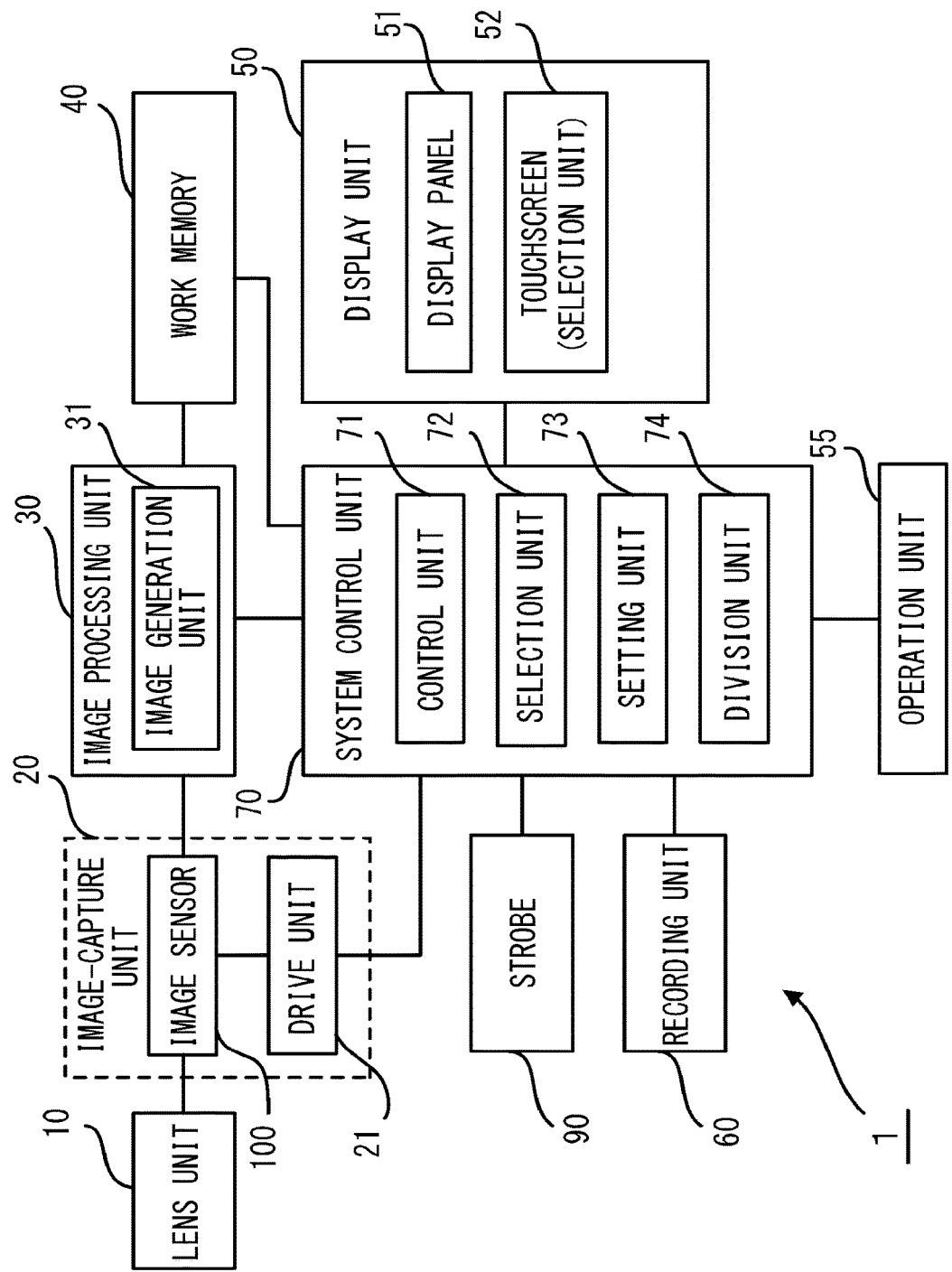
FIG. 7 is a block diagram showing the configuration of a digital camera according to a first embodiment.

FIG. 7 is a block diagram showing the configuration of the digital camera 1 according to the first embodiment. As shown in FIG. 7, the digital camera 1 includes the camera body 2 and lens unit 10. As described above, the lens unit 10 is an interchangeable lens which is detachable from the camera body 2. Accordingly, the digital camera 1 does not need to include the lens unit 10. Note that the lens unit 10 may be integral with the digital camera 1. In a state in which the lens unit 10 is connected to the camera body 2, it guides light from a subject to the image-capture unit 20.

As described above, the lens unit 10 includes the lens drive control unit 15 (see FIG. 6). The lens unit 10 also includes the imaging optical system 11, that is, the lens 11*a*, zooming lens 11*b*, and focusing lens 11*c*. When the lens unit 10 is coupled to the camera body 2, the lens drive control unit 15 transmits lens information stored in the memory to the system control unit 70 of the camera body 2 and receives control information from the system control unit 70. The lens drive control unit 15 then controls the drive of the zooming lens 11*b*, focusing lens 11*c*, and diaphragm 14 on the basis of the control information.

As shown in FIG. 7, the camera body 2 includes the image-capture unit 20, the image processing unit 30, a work memory 40, the display unit 50, an operation unit 55, the recording unit 60, the system control unit 70, and a strobe 90.

The image-capture unit 20 includes the image sensor 100 and a drive unit 21. The drive unit 21 is a control circuit configured to control the drive of the image sensor 100 in accordance with an instruction from the system control unit 70. Specifically, the drive unit 21 controls the charge accumulation time or frequency, which is a control parameter, by controlling the timing (or the cycle of the timing) when reset pulses or transfer pulses are applied to the reset transistors 303 or transfer transistors 302, respectively. The drive unit 21 also controls the frame rate by controlling the timing (or the cycle of timing) when reset pulses, transfer pulses, or selection pulses are applied to the reset transistors 303, transfer transistor 302, or select transistors 305, respectively. The drive unit 21 also controls the thinning-out rate by setting pixels to which reset pulses, transfer pulses, and selection pulses are applied.

The drive unit 21 also controls the ISO sensitivity of the image sensor 100 by controlling the gain (also called the gain factor or amplification factor) of the amplifier 412. The drive unit 21 also sets the number of rows or columns whose pixel signals are summed up by sending an instruction to the arithmetic circuit 416. The drive unit also sets the digitized bit number by sending an instruction to the signal processing circuit 413. The drive unit 21 also sets a region in units of blocks in the pixel region (image-capture region) 113A of the image sensor 100. As seen above, the drive unit 21 serves as an image sensor control unit that causes the image sensor 100 to capture an image under image-capture conditions which vary among the groups of multiple blocks and then to output pixel signals. The system control unit 70 sends an instruction about the positions, shapes, ranges, or the like of the blocks to the drive unit 21.

The image sensor 100 passes the pixel signals from the image sensor 100 to the image processing unit 30. The image processing unit 30 then performs various types of image processing on the RAW data including the pixel signals using the work memory 40 as work space to generate image data in a predetermined file format (e.g., JPEG). For example, the image processing unit 30 performs color signal processing (color tone correction) on the signals obtained from the Bayer arrays to generate RGB image signals. The image processing unit 30 then performs image processing such as white balance adjustment, sharpness adjustment, gamma correction, gradation adjustment, or the like on the RGB image signals. The image processing unit 30 also compresses the resulting signals in a predetermined compression format (JPEG format, MPEG format, or the like), if necessary. The image processing unit 30 then outputs the resulting image data to the recording unit 60. The image processing unit 30 also outputs the image data to the display unit 50.

Parameters referred to when the image processing unit performs image processing are also included in the control parameters (image-capture conditions). For example, parameters such as color signal processing (color tone correction), white balance adjustment, gradation adjustment, and compression rate are included in the control parameters. Signals read from the image sensor 100 change according to the charge accumulation time or the like, and the parameters referred to in image processing also change according to the changes in the signals. The image processing unit 30 sets different control parameters with respect to the respective blocks and performs image processing such as color signal processing on the basis of these control parameters.

The image processing unit 30 also extracts frames corresponding to predetermined timings from multiple frames chronologically obtained from the image-capture unit 20. The image processing unit 30 also discards frames corresponding to predetermined timings from multiple frames chronologically obtained from the image-capture unit 20. Thus, it is possible to reduce the amount of data to reduce the load on subsequent processes. The image processing unit also calculates one or more frames to be interpolated between multiple frames chronologically obtained from the imaging unit 20 and then interpolates the calculated one or more frames between the multiple frames. Thus, it is possible to reproduce moving images in such a manner that the images move more smoothly. While the drive unit 21 is configured to control the thinning-out rate, other configurations may be employed. For example, the image processing unit 30 or arithmetic circuit 416 may control the thinning-out rate by discarding predetermined pixel signals of pixel signals read from all the pixels by the drive unit 21.

In the present embodiment, as shown in FIG. 7, the image processing unit 30 includes an image generation unit 31. The image generation unit 31 generates image data by performing various types of image processing on the RAW data including the pixel signals outputted from the image-capture unit 20. The image generation unit 31 generates first image data on the basis of RAW data including image signals from the first image-capture region, second image data on the basis of RAW data including image signals from the second image-capture region, third image data on the basis of RAW data including image signals from the third image-capture region, and fourth image data on the basis of RAW data including image signals from the fourth image-capture region.

The work memory 40 temporarily stores image data or the like while the image processing unit 30 performs image processing. The display unit 50 displays images (still images, moving images, live view images) captured by the image-capture unit 20 or various types of information. The display unit 50 includes a display surface (display panel) 51 such as a liquid crystal display panel. A touchscreen (selection unit) 52 is formed on the display surface 51 of the display unit 50. When the user touches the touchscreen 52 to perform an operation such as a selection of a menu, the touchscreen 52 outputs a signal indicating the touched position to the system control unit 70.

The operation unit 55 includes a release switch operated by the user (a switch pressed to acquire a still image), a moving image switch (a switch pressed to acquire images of a motion), and other operation switches. The operation unit 55 outputs a signal corresponding to an operation of the user to the system control unit 70. The recording unit 60 has a card slot into which a storage medium such as a memory card can be inserted. The recording unit 60 stores, in a storage medium inserted in the card slot, image data generated by the image processing unit 30 or various types of data. The recording unit 60 also includes an internal memory. The recording unit 60 can also record, in the internal memory, image data generated by the image processing unit 30 or various types of data.

The system control unit 70 controls the entire processing and operation of the digital camera 1. The system control unit 70 includes a body-side central processing unit (CPU). In the present embodiment, the system control unit 70 divides the image-capture surface (pixel region 113A) of the image sensor 100 (image-capture chip 113) into multiple blocks and causes the image sensor 100 to capture an image with charge accumulation times (or charge accumulation frequencies), frame rates, and gains which vary among the blocks. To this end, the system control unit 70 transmits the positions, shapes, and ranges of the blocks and the accumulation conditions for the blocks to the drive unit 21.

The system control unit 70 also causes the image sensor 100 to capture an image at thinning-out rates, the numbers of rows or columns whose pixel signals are summed up, and digitized bit numbers which vary among the blocks. To this end, the system control unit 70 transmits the image-capture conditions (thinning-out rates, the numbers of rows or columns whose pixel signals are summed up, and digitized bit numbers) for the blocks to the drive unit 21. The image processing unit 30 also performs image processing under image-capture conditions (control parameters such as color signal processing, white balance adjustment, gradation adjustment, and compression rate) which vary among the blocks. To this end, the image processing unit 70 transmits the image-capture conditions (control parameters such as color signal processing, white balance adjustment, gradation adjustment, and compression rate) for the blocks to the image processing unit 30.

The system control unit 70 causes the recording unit 60 to record image data generated by the image processing unit 30. The system control unit 70 also causes the image processing unit 30 to output the generated image data to the display unit 50 so that an image is displayed on the display unit 50. The system control unit 70 also causes the storage unit 60 to output the recorded image data to the display unit 50 so that an image is displayed on the display unit 50. Images displayed on the display unit 50 include still images, moving images, and live view images.

The system control unit 70 also outputs control information to the lens drive control unit 15 to cause the lens drive control unit 15 to control the drive of the focusing lens 11c and diaphragm 14. The system control unit is implemented when the body-side CPU performs processing on the basis of a control program.

In the present embodiment, as shown in FIG. 7, the system control unit 70 includes a control unit 71, a selection unit 72, a setting unit 73, and a division unit 74. The control unit 71 causes the image generation unit 31 to output generated image data to the display unit 50 so that an image is displayed on the display surface 51 of the display unit 50. The control unit 71 also causes the display surface 51 of the display unit 50 to display a preset menu image (see FIG. 8).

The selection unit 72 selects one of the four display regions (first display region 511, second display region 512, third display region 513, and fourth display region 514) in response to a touch on the touchscreen 52 by the user. The setting unit 73 sets image-capture conditions (including accumulation conditions) in response to a touch on the touchscreen 52 by the user, or automatically. The setting unit 73 may set the same image-capture conditions for the entire pixel region 113A of the image sensor 100. The setting unit 73 may also set different image-capture conditions for the respective image-capture regions (first to fourth image-capture regions) shown in FIG. 5. The setting unit 73 also causes the image sensor 100 to capture an image under predetermined image-capture conditions or image-capture conditions changed in response to an operation of the user. The division unit 74 divides the pixel region 113A of the image sensor 100 into the first to fourth image-capture regions as shown in FIG. 5.

The strobe 90 is a device configured to emit light (a flash of light) in order to image. The strobe 90 emits light in a predetermined amount on the basis of an instruction signal from the system control unit 70.

Figure 8:
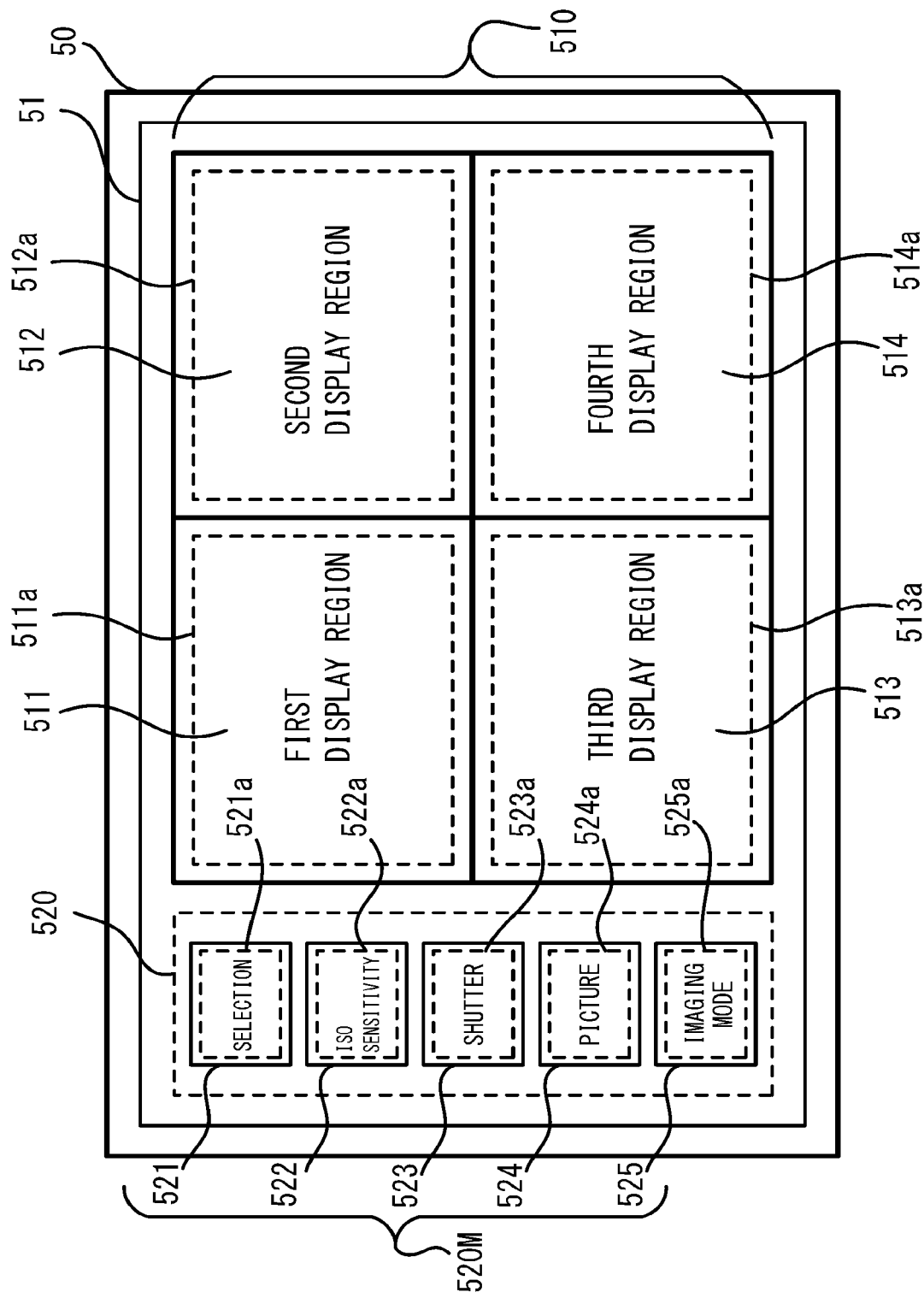
FIG. 8 is a diagram showing a display unit of the digital camera according to the first embodiment.

FIG. 8 is a diagram showing the display unit 50 of the digital camera 1 according to the present embodiment. As shown in FIG. 8, the display unit 50 has the display surface 51. The display surface 51 has the image display region 510 and an operation button display region 520. The image display region 510 is a region for displaying images based on image data generated by the image-capture unit 20. Examples of images displayed on the image display region 510 include still images, moving images, and live view images. The operation button display region 520 is a region for displaying a menu image 520M for the user to set image-capture conditions or the like. The image display region 510 and operation button display region 520 are disposed on the single display surface 51.

The image display region 510 is divided into multiple display regions so that multiple images can be displayed. For example, the image display region 510 is divided into four display regions so that images based on four sets of image data generated by the image-capture unit 20 are displayed. Of the four display regions, the upper-left display region is referred to as a first display region 511; the upper-right display region as a second display region 512; the lower-left display region as a third display region 513; and the lower-right display region as a fourth display region 514.

In the example shown in FIG. 8, the first display region 511, second display region 512, third display region 513, and fourth display region 514 have the same area. These display regions may have different areas. For example, the first display region may have a larger area than the second display region, third display region, or fourth display region; the second display region may have a larger area than the first display region, third display region, or fourth display region; the third display region may have a larger area than the first display region, second display region, or fourth display region; or the fourth display region may have a larger area than the first display region, second display region, or third display region.

The first display region 511 is a region for displaying an image based on image data generated in the first image-capture region shown in FIG. 5 (hereafter referred to as the first image); the second display region 512 is a region for displaying an image based on image data generated in the second image-capture region shown in FIG. 5 (hereafter referred to as the second image); the third display region 513 is a region for displaying an image based on image data generated in the third image-capture region shown in FIG. 5 (hereafter referred to as the third image); and the fourth display region 514 is a region for displaying an image based on image data generated in the fourth image-capture region shown in FIG. 5 (hereafter referred to as the fourth image). As described above, the first to fourth image-capture regions shown in FIG. 5 are uniformly disposed in the entire pixel region 113A; therefore, the first to fourth images all look like the same subject image. However, as described above, images are captured under different image-capture conditions in the first to fourth image-capture regions shown in FIG. 5. Accordingly, the brightness of the subject, blurring of the subject, smoothness of a movement of the subject in moving images, and the like vary among the image-capture conditions.

Examples of the first image include first live view images, first still images, and first moving images; examples of the second image include second live view images, second still images, and second moving images; example of the third image include third live view images, third still images, and third moving images; and examples of the fourth image include fourth live view images, fourth still image, and fourth moving images.

The display unit 50 includes the touchscreen 52. The touchscreen 52 is disposed on the display surface 51. The touchscreen 52 is formed in such a manner that a first touch region 511a overlaps the first display region 511; a second touch region 512a overlaps the second display region 512; a third touch region 513a overlaps the third display region 513; and a fourth touch region 514a overlaps the fourth display region 514. When the user presses any of the first touch region 511a, second touch region 512a, third touch region 513a, and fourth touch region 514a, the touch region detects that it has been pressed (touched) and outputs a detection signal indicating the pressed position (the pressed touch region) to the system control unit 70.

The operation button display region 520 is disposed near the image display region 510. Displayed in the operation button display region 520 is the menu image 520M for the user to select a display region or set image-capture conditions, imaging mode, or the like. The menu image 520M includes a selection button image 521, an ISO sensitivity button image 522, a shutter speed button image 523, a picture control button image 524, and an imaging mode button image 525. The selection button image 521 is an image for the user to select one of the first to fourth images displayed on the first to fourth display regions, respectively. The ISO sensitivity button image 522 is an image for the user to set the ISO sensitivity (i.e., gain). The shutter speed button image 523 is an image for the user to set the shutter speed (i.e., exposure time). The shutter speed corresponds to the charge accumulation time. The picture control button image 524 is an image for the user to set (adjust) image properties such as image tone, hue, or contrast. The imaging mode button image 525 is an image for the user to make a selection as to whether to set image-capture conditions manually or automatically.

The touchscreen 52 is formed in such a manner that a touch region 521a overlaps the selection button image 521; a touch region 522a overlaps the ISO sensitivity button image 522; a touch region 523a overlaps the shutter speed button image 523; a touch region 524a overlaps the picture control button image 524; and a touch region 525a overlaps the imaging mode button image 525. When the user presses any of the touch region 521a, touch region 521a, touch region 521a, and touch region 525a, the touch region detects that it has been pressed (touched) and outputs a detection signal indicating the pressed position (the pressed touch region) to the system control unit 70.

Figure 9:
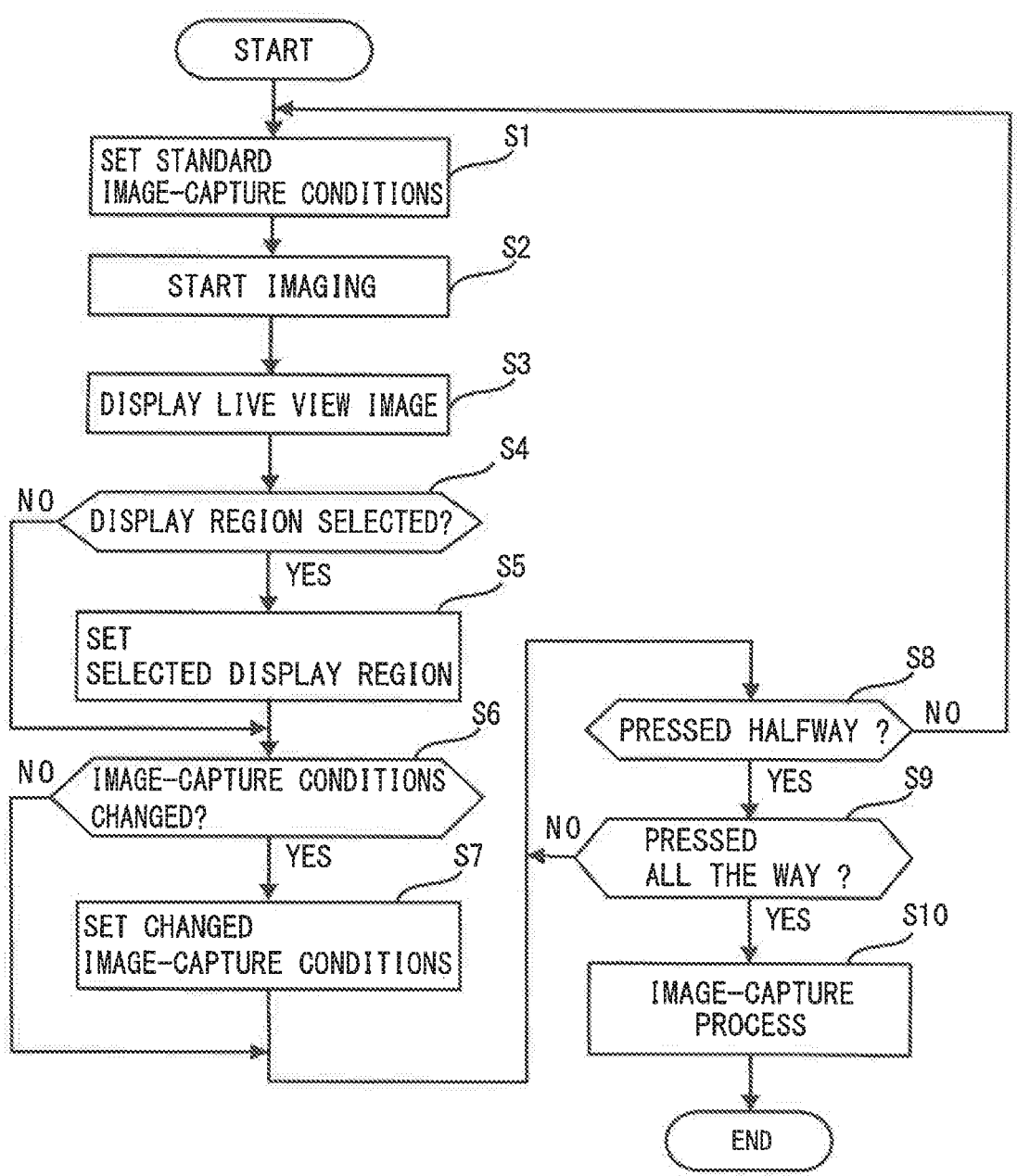
FIG. 9 is a flowchart showing an imaging operation performed by a system control unit according to the first embodiment.

Next, a still image acquisition operation of the digital camera 1 according to the first embodiment will be described. FIG. 9 is a flowchart showing an imaging operation performed by the system control unit 70 according to the first embodiment. FIGS. 10 to 13 are drawings each showing an example display of the display surface 51 according to the first embodiment.

In the process shown in FIG. 9, the user powers on the digital camera 1 and then operates the operation unit 55 or the like to start imaging and thus the division unit 74 divides the pixel region 113A of the image sensor 100 into multiple image-capture regions (first to fourth image-capture regions) as shown in FIG. 5 and sets these image-capture regions. Then, the setting unit 73 sets predetermined standard image-capture conditions for the first to fourth image-capture regions set by the division unit 74 (step S1). For example, the setting unit 73 sets an ISO sensitivity of "100," a shutter speed of "½ s," and the like as standard image-capture conditions for the first image-capture region. The setting unit 73 also sets an ISO sensitivity of "200," a shutter speed of "1/100 s," and the like as standard image-capture conditions for the second image-capture region. The setting unit 73 also sets an ISO sensitivity of "400," a shutter speed of "1/500 s," and the like as standard image-capture conditions for the third image-capture region. The setting unit 73 also sets an ISO sensitivity of "800," a shutter speed of "1/1000 s," and the like as standard image-capture conditions for the fourth image-capture region.

Then, the system control unit 70 starts an imaging operation (step S2). The control unit 71 displays, in the first display region 511 of the display surface 51, a first live view image based on first image data generated in the first image-capture region of the image sensor 100. The control unit 71 also displays, in the second display region 512 of the display surface 51, a second live view image based on second image data generated in the second image-capture region of the image sensor 100. The control unit 71 also displays, in the third display region 513 of the display surface 51, a third live view image based on third image data generated in the third image-capture region of the image sensor 100. The control unit 71 also displays, in the fourth display region 514 of the display surface 51, a fourth live view image based on fourth image data generated in the fourth image-capture region of the image sensor 100 (step S3). In the example shown in FIG. 10, first to fourth live view images of a waterfall are displayed on the first display region 511, second display region 512, third display region 513, and fourth display region 514, respectively. Since images are captured under different image-capture conditions in the first to fourth image-capture regions, the live view images displayed in the first display region 511, second display region 512, third display region 513, and fourth display region 514 vary in the brightness, blurring, contrast, or the like of the subject (moving subject).

The user can check the differences among the images based on the differences among the image-capture conditions by making comparison among the first to fourth live view images displayed on the first display region 511, second display region 512, third display region 513, and fourth display region 514 of the image display region 510. The user then touches the selection button image 521 (i.e., touch region 521*a*) in order to select one of the first to fourth live view images. Thus, the display regions are allowed to be selected, that is, the four touch regions (first touch region 511*a*, second touch region 512*a*, third touch region 513*a*, and fourth touch region 514*a*) of the touchscreen 52 are allowed to detect a touch. The user then touches one of the four display regions (first display region 511, second display region 512, third display region 513, and fourth display region 514) to select the touched display region. The touchscreen 52 then outputs, to the system control unit 70, a detection signal corresponding to the touch region touched by the user.

The selection unit 72 identifies the display region selected by the user on the basis of the detection signal from the touchscreen 52. In the examples shown in FIGS. 11 to 13, the first display region 511 is selected by the user. The selection unit 72 then determines whether any of the first display region 511, second display region 512, third display region 513, and fourth display region 514 has been selected by the user (step S4). If so, the selection unit 72 sets the display region (the first display region 511 in FIG. 11) selected by the user (step S5).

Specifically, the selection unit 72 outputs, to the drive unit 21, a signal indicating the positions or the like of blocks corresponding to the display region selected by the user.

The user can make a change to any of the image-capture conditions of the selected display region (i.e., one of the first to fourth image-capture regions). The setting unit 72 determines whether the user has made a change to any image-capture region (step S6). If so, the selection unit 72 sets the changed image-capture condition (step S7).

Figure 11:
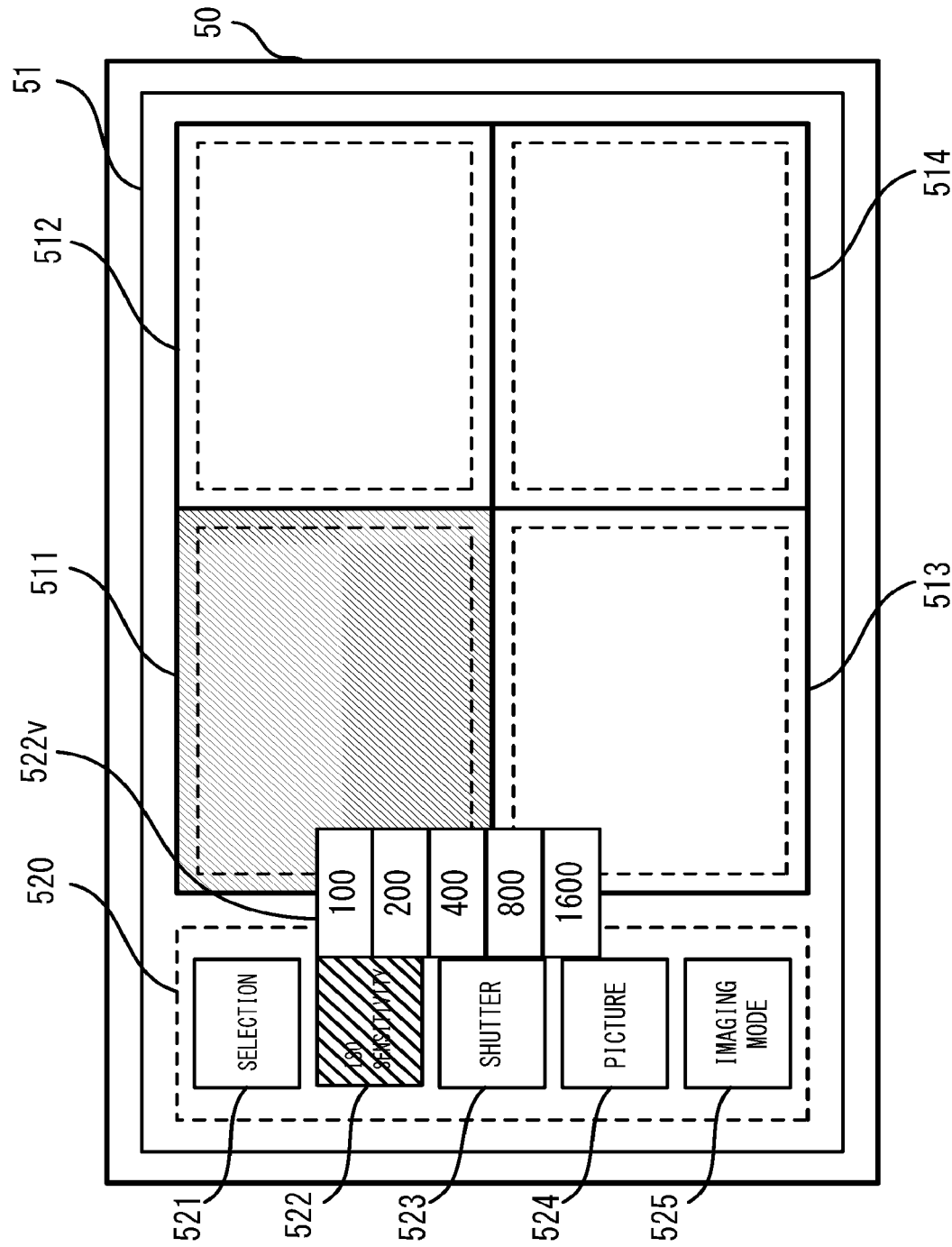
FIG. 11 is a drawing showing an example display of the display surface according to the first embodiment.

For example, if the user wishes to set an ISO sensitivity as an image-capture condition for the first display region 511, he or she touches the ISO sensitivity button image 522 (i.e., touch region 522*a*). The touchscreen 52 then outputs, to the system control unit 70, a detection signal corresponding to the touch region 522*a* touched by the user. As shown in FIG. 11, the control unit 71 displays multiple ISO sensitivity values on a side of the ISO sensitivity button image 522. In the example shown in FIG. 11, "100," "200," "400," "800," and "1600" are displayed as ISO sensitivity values. At this time, the setting unit 73 sets new touch regions on the touchscreen 52 in such a manner that the new touch regions overlap the ISO sensitivity values. The user then touches one of the ISO sensitivity values. The touchscreen 52 then outputs, to the system control unit 70, a detection signal corresponding to the touch region touched by the user. The setting unit 73 then sets the ISO sensitivity value touched by the user. Specifically, the setting unit 73 outputs, to the drive unit 21, a signal indicating a gain corresponding to the ISO sensitivity value selected by the user.

If the user wishes to set a shutter speed (charge accumulation time) as an image-capture condition for the first display region 511, he or she performs an operation similar to setting of the ISO sensitivity. That is, if the user wishes to set a shutter speed as an image-capture condition, he or she touches the shutter speed button image 523 (i.e., touch region 523*a*). The touchscreen 52 then outputs, to the system control unit 70, a detection signal corresponding to the touch region 523*a* touched by the user. The control unit 71 then displays multiple shutter speed values on a side of the shutter speed button image 523. The user then touches one of the shutter speed values. The setting unit 73 then sets the shutter speed value touched by the user. Specifically, the setting unit 73 outputs, to the drive unit 21, a signal indicating the shutter speed selected by the user.

Figure 12:
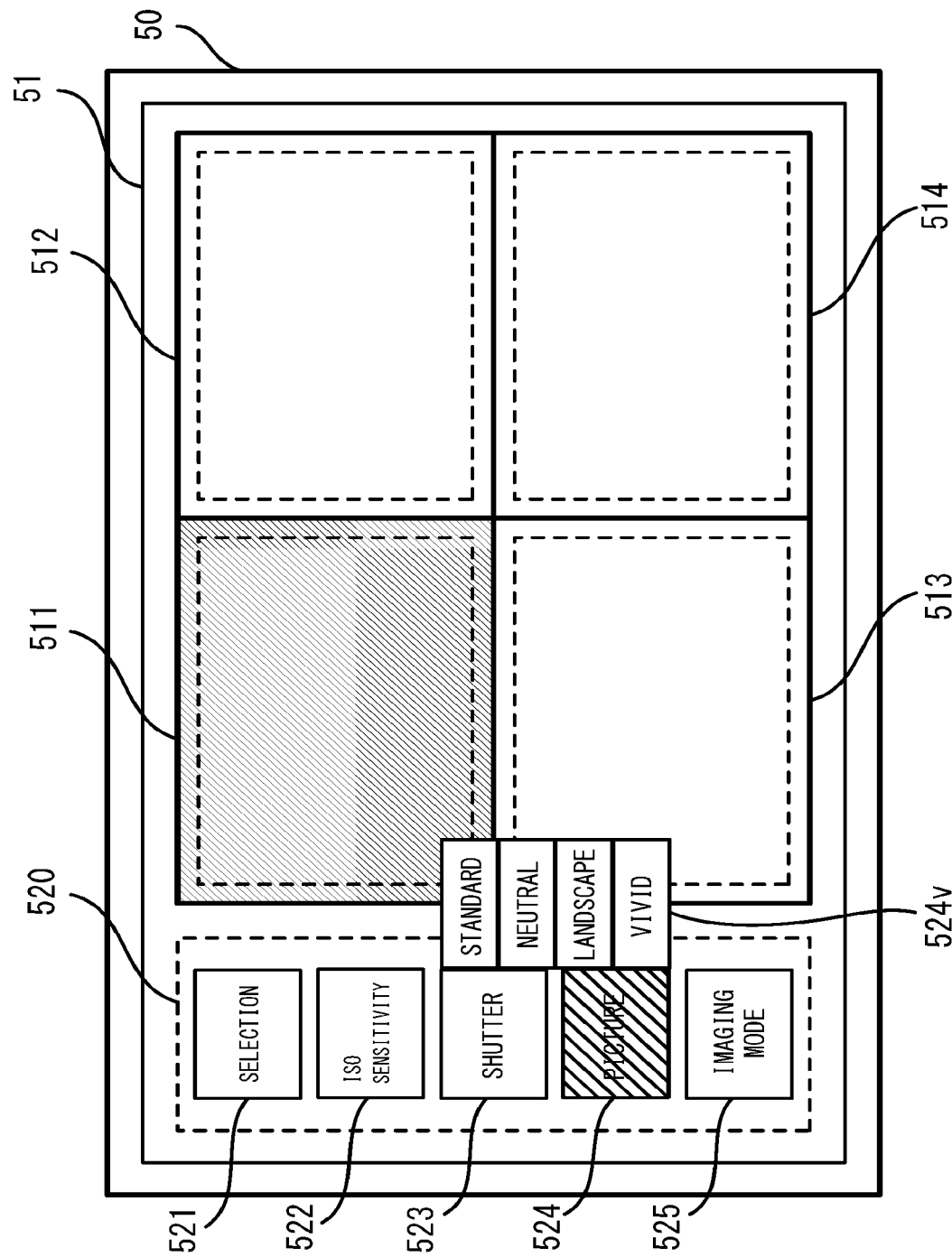
FIG. 12 is a drawing showing an example display of the display surface according to the first embodiment.

If the user wishes to set picture control as an image-capture condition for the first display region 511, he or she touches the picture control button image 524 (i.e., touch region 524*a*). The touchscreen 52 then outputs, to the system control unit 70, a detection signal corresponding to the touch region 524*a* touched by the user. As shown in FIG. 12, the control unit 71 displays multiple picture control types on a side of the picture control button image 524. In the example shown in FIG. 12, "standard," "neutral," "landscape," and "vivid" are displayed as picture control types. As used herein, "standard" refers to a picture control type in which the image processing unit 30 adjusts the image to a standard image which is not unbalanced in the edge strength, contrast, brightness, color depth, or the like of the subject; "neutral" refers to a picture control type in which the image processing unit 30 adjusts the image to an image in which gradation or hue specific to the subject is faithfully reproduced and which is closest to the real subject; "landscape" refers to a picture control type in which the image processing unit 30 adjusts a natural landscape, a streetscape, or the like to a stereoscopic image with high gradation; and "vivid" refers to a picture control type in which the image processing unit 30 adjusts the image to a vivid image in which the edge or contrast of the subject is enhanced.

At this time, the setting unit 73 sets new touch regions in the touchscreen 52 in such a manner that the new touch regions overlap the picture control types. The user then touches one of the picture control types. The touchscreen 52 then outputs, to the system control unit 70, a detection signal corresponding to the touch region touched by the user. The setting unit 73 then sets the picture control type touched by the user. Specifically, the setting unit 73 outputs, to the image processing unit 30, a signal indicating the picture control type selected by the user.

Figure 13:
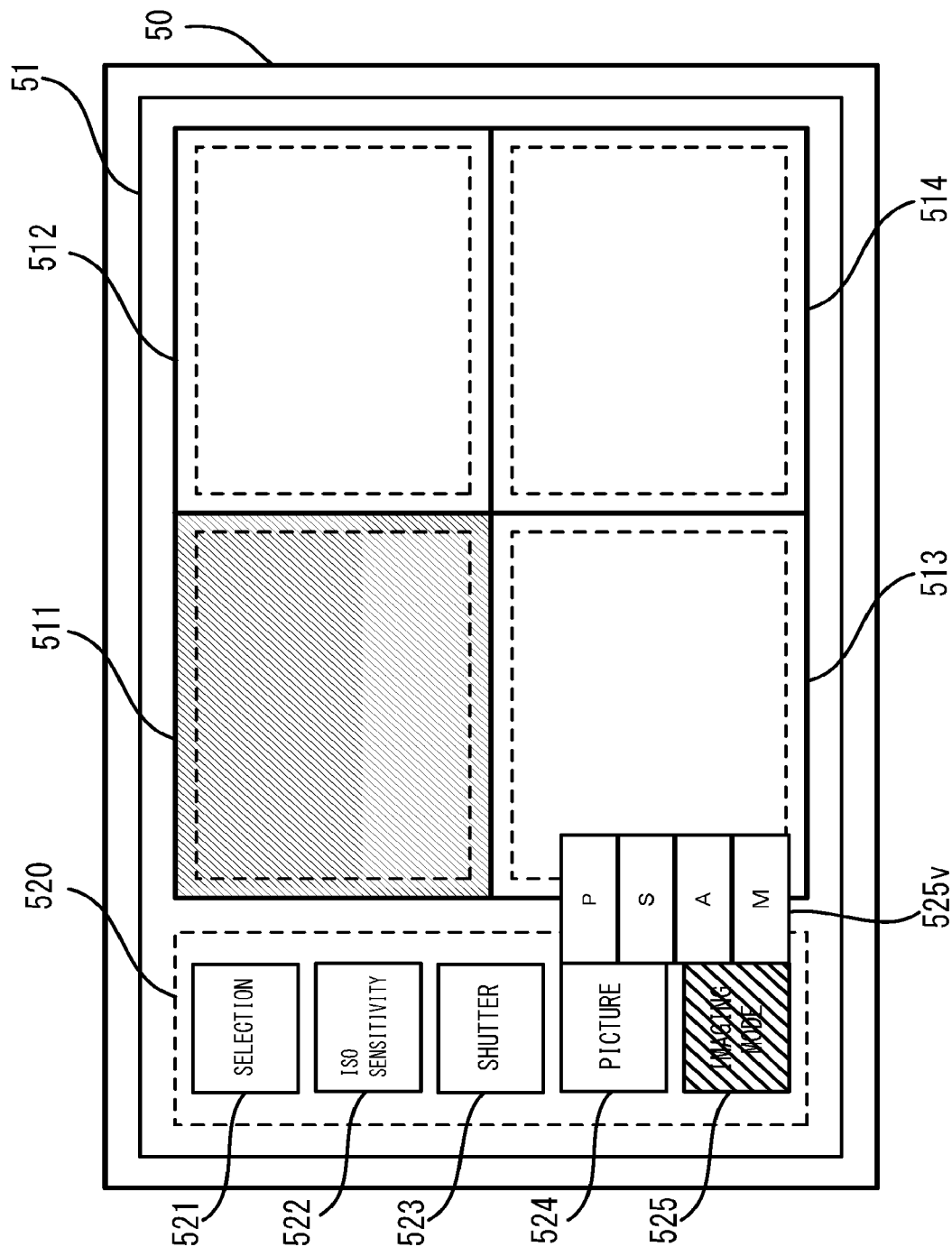
FIG. 13 is a drawing showing an example display of the display surface according to the first embodiment.

If the user wishes to set an imaging mode as an image-capture condition for the first display region 511, he or she touches the imaging mode button image 525 (i.e., touch region 525*a*). The touchscreen 52 then outputs, to the system control unit 70, a detection signal corresponding to the touch region 525*a* touched by the user. As shown in FIG. 13, the control unit 71 displays "P," "S," "A," and "M" on a side of the imaging mode button image 525. "P" represents P mode (program auto), in which the aperture value and shutter speed are automatically determined so that correct exposure is obtained; "S" represents S mode (shutter priority mode), in which an aperture value with respect to a shutter speed selected by the user is determined such that correct exposure is obtained; "A" represents A mode (aperture priority mode), in which a shutter speed with respect to an aperture value selected by the user is determined automatically such that correct exposure is obtained; and "M" represents M mode (manual mode), in which the user selects both an aperture value and a shutter speed. Note that while the system control unit 70 (setting unit 73) can set different image-capture conditions for the respective blocks of the pixel region 113A as described above, it cannot set an aperture value for each block and therefore sets an aperture value for the entire image-capture region 113A.

At this time, the setting unit 73 sets new touch regions in the touchscreen 52 in such a manner that the new touch regions overlap the imaging modes. The user then touches one of the imaging modes. The touchscreen 52 then outputs, to the system control unit 70, a detection signal corresponding to the touch region touched by the user. The setting unit 73 then sets the imaging mode touched by the user. If one of "P," "S," "A" is selected, the setting unit automatically determines at least one of the aperture value and shutter speed so that correct exposure is obtained. If the setting unit 73 determines the shutter speed, it outputs a signal indicating the shutter speed to the drive unit 21. If the setting unit 73 determines the aperture value, it outputs, to the lens drive control unit 15, control information corresponding to the aperture value.

The drive unit 21 receives the signal indicating, in units of blocks, the first image-capture region corresponding to the first display region 511 selected by the user. The drive unit 21 also receives the signal indicating the image-capture conditions selected by the user. The drive unit 21 then drives the image-capture unit so that the image-capture unit 20 captures an image under the indicated image-capture conditions (shutter speed, ISO sensitivity) in the blocks corresponding to the first display region 511. The image processing unit 30 receives the signal indicating the image-capture conditions selected by the user. The image processing unit 30 then performs image processing on RAW data from the first image-capture region under the indicated image-capture conditions (control parameters such as white balance, gradation, and color tone correction). The lens drive control unit 15 adjusts the aperture diameter of the diaphragm 14 on the basis of the control information from the system control unit 70.

By changing the image-capture conditions of the first image-capture region as described above, changes occur in the first live view image displayed in the first display region 511. For example, by increasing the ISO sensitivity, a bright image of the subject is captured even with a small amount of light. Further, dark portions of the first live view image are brightened. By increasing the shutter speed, blurring of the moving subject is reduced.

As seen above, if the user selects one of the first display region 511, second display region 512, third display region 513, and fourth display region 514 and then sets image-capture conditions for the selected display region, he or she can check changes in the live view image corresponding to the changes made to the image-capture conditions. In this case, the image-capture conditions selected by the user may not be conditions suitable for correct exposure. However, the user can recognize that the changes made to the image-capture conditions may result in overexposure or underexposure. Further, the user can understand how the image changes due to changes made to any image-capture condition. As seen above, the user can make changes to the image-capture conditions and then check multiple live view images before capturing an image.

Steps S1 to S7 described above are repeated until the user presses the release switch of the operation unit 55 halfway (step S8). While the case where the user selects the first display region 511 of the four display regions has been described with reference to FIGS. 10 to 13, a similar process is performed when the user selects the second display region 512, third display region 513, or fourth display region 514.

Although not shown in FIGS. 10 to 13, the user may set image-capture conditions other than the ISO sensitivity, shutter speed, and picture control for each region. For example, the user may set the frame rate, thinning-out rate, the number of rows or columns whose pixel signals are summed up, the digitized bit number, and the like as image-capture conditions for each display region. The user may also set parameters such as color signal processing, white balance adjustment, gradation adjustment, and compression rate as image-capture conditions for each display region.

Subsequently, the system control unit 70 determines whether the release switch has been pressed halfway (SW1 operation) (step S8). A halfway press is used as an instruction for causing the system control unit 70 to start preparation for capturing an image. Although not shown in FIG. 8, the system control unit 70 also performs steps such as control of auto focus (AF), where the focus is adjusted automatically.

The system control unit 70 then determines whether the release switch has been pressed all the way (SW2 operation) (step S9). If so, the setting unit 73 causes the image sensor 100 to capture an image (step S10). Note that a main image capture refers to an image capture based on an all the way press in step S10. In the present embodiment, the image-capture unit 20 performs the main image capture in the pixel region (image-capture region) 113A of the image sensor 100 under the image-capture conditions of the display region (live view image) lastly selected by the selection unit 72 in step S5. The control unit 71 then displays, in the entire image display region 510, the image (still image) obtained by the main image capture in the pixel region (image-capture region) 113A. Thus, the user can check the captured image using the large display region.

While the still image acquisition operation has been described with reference to FIGS. 9 to 13, a moving image acquisition operation is also performed in a similar manner. In this case, moving images captured under different image-capture conditions (e.g., frame rate) in the respective image-capture regions (first to fourth image-capture regions) are displayed in the respective display regions (first display region 511, second display region 512, third display region 513, and fourth display region 514). In this case, a button for setting the frame rate is preferably displayed in the operation button display region 520. As with still images, the control unit 71 displays, in the entire image display region 510, moving images obtained by the main image capture in the pixel region (image-capture region) 113A.

As described above, the digital camera 1 of the first embodiment includes: the image-capture unit 20 having multiple first image sensors (some image sensors in the image sensor 100) and multiple second image sensors (image sensors other than the some image sensors in the image sensor 100) disposed therein, the first image sensors being configured to capture an image under first image-capture conditions, the second image sensors being configured to capture an image under second image-capture conditions different from the first image-capture conditions, the image-capture unit 20 being configured to output first image data generated based on a subject image which has entered the first image sensors and second image data generated based on a subject image which has entered the second image sensors; and the control unit 71 configured to display a first image based on the first image data (e.g., an image displayed on the first display region 511) and a second image based on the second image data (e.g., an image displayed on the second display region 512) on the display unit 50 in such a manner that a selection can be made between respective recording forms of the first image data and second image data. According to this embodiment, the user can check changes in multiple images corresponding to changes made to image-capture conditions.

Further, in the first embodiment, both the first and second images are live view images; the digital camera 1 includes the selection unit 72 configured to select between the respective recording forms of the first image data and second image data; and the image-capture unit 20 performs the main image capture under image-capture conditions corresponding to the recording form selected by the selection unit 72. According to this configuration, the user can check multiple live view images captured under different image-capture conditions before starting to perform the main image capture for acquiring a still image or moving images. Further, in the first embodiment, the selection unit 72 is provided with the touchscreen 52 formed on the display unit 50. Thus, the user can select a live view image with a simple operation.

Further, in the first embodiment, the digital camera 1 includes the division unit 74 configured to divide the multiple image sensors of the image-capture unit 20 into at least the first and second image sensors. According to this configuration, the control unit 71 can display at least two live view images on the display unit 50. Further, in the first embodiment, the division unit 74 disposes the multiple first image sensors and the multiple second image sensors across the pixel region 113A of the image-capture unit 20. According to this configuration, the image-capture unit 20 can capture multiple live view subject images which look like the same subject image for the user. Accordingly, the user can easily check the differences among the live view subject images based on the differences among the image-capture conditions.

Further, in the first embodiment, the digital camera 1 includes the setting unit 73 configured to set first and second image-capture conditions. According to this configuration, it is possible to cause the image sensor 100 to capture images under predetermined image-capture conditions, as well as to capture images under image-capture conditions selected by the user. Further, in the first embodiment, the setting unit 73 makes a change to at least one of the frame rate, gain, and exposure time serving as image-capture conditions. According to this configuration, before capturing an image, the user can make differences in frame rate, gain, or exposure time (shutter speed) among the multiple image-capture regions (multiple live view images) and thus make changes to live view images and then check the changed live view images.

Further, in the first embodiment, the setting unit 73 makes changes to at least one of white balance, gradation, and color tone correction serving as image-capture conditions. According to this configuration, before capturing an image, the user can make differences in white balance, gradation, or color tone correction among the multiple image-capture regions (multiple live view images) and thus make changes to the live view images and then check the changed live view images.

In the first embodiment, in response to a change being made to one of the exposure time (shutter speed) and gain (ISO sensitivity), the setting unit 73 may make a change to the other of the exposure time and gain so that the first and second images have the same brightness. Specifically, to allow the first and second images to have the same correct brightness, the setting unit 73 reduces the gain when increasing the exposure time of one of the first and second image-capture regions; it increases the gain when reducing the exposure time thereof. According to this configuration, the user can previously check the difference between the images based on different combinations of the exposure time and gain which result in the same brightness.

As shown in FIG. 7, the digital camera 1 has been described as an example of an electronic apparatus in the first embodiment. However, the electronic apparatus is not limited to the digital camera 1 and may be any apparatus, including smartphones, mobile phones, and personal computers, as long as the apparatus has an image-capture function. In the digital camera 1 according to the first embodiment shown in FIG. 7, the display unit 50 may be disposed outside the electronic apparatus. In this case, the system control unit 70 and display unit 50 are each provided with a communication unit configured to receive or transmit signals (image data, control signals, or the like) by wire or wirelessly. The image processing unit 30 and system control unit 70 may be integral with each other. In this case, a system control unit including one body-side CPU serves as the image processing unit 30 and system control unit 70 when it performs processing on the basis of a control program.

Second Embodiment

In the first embodiment, the same image-capture conditions (including accumulation conditions) are set across each display region (first display region 511, second display region 512, third display region 513 and fourth display region 514) in the image display region 510. In a second embodiment, on the other hand, each display region is divided into multiple regions, and different image-capture conditions (including accumulation conditions) are set for the resulting regions.

Figure 14:
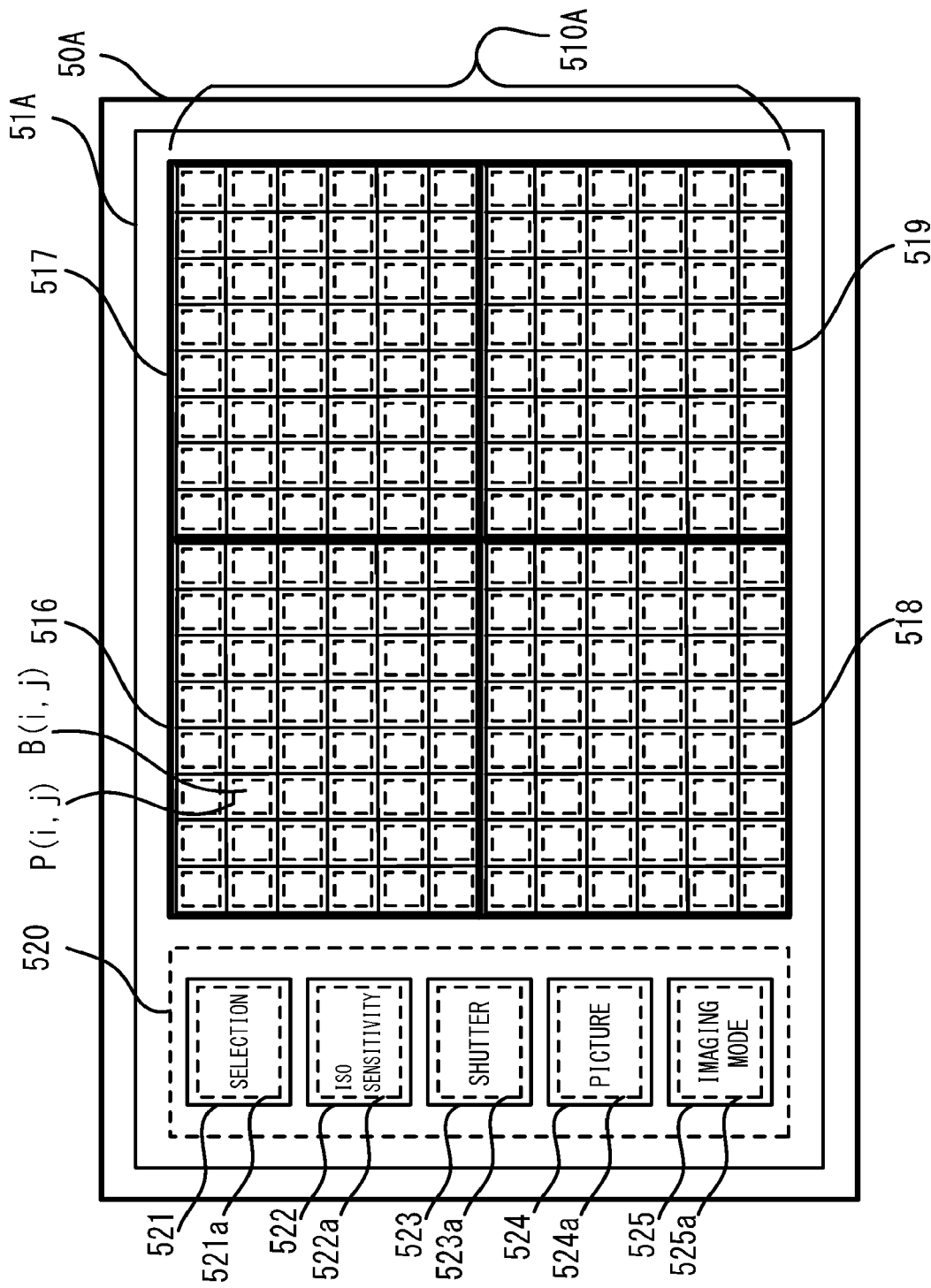
FIG. 14 is a diagram showing a display unit of a digital camera according to a second embodiment.

FIG. 14 is a diagram showing a display unit 50A of a digital camera 1 according to the second embodiment. As shown in FIG. 14, a display surface 51A of the display unit 50A has an image display region 510A and an operation button display region 520, as in the display surface 51 shown in FIG. 8. The image display region 510A is a region for displaying images captured by the image-capture unit 20, that is, still images, moving images, or live view images. The operation button display region 520 is a region for displaying menus on which the user sets image-capture conditions or the like.

The image display region 510A is divided into four display regions (first display region 516, second display region 517, third display region 518, fourth display region 519). The first display region 516, second display region 517, third display region 518, and fourth display region 519 correspond to the first display region 511, second display region 512, third display region 513, and fourth display region 514, respectively, shown in FIG. 8. Multiple blocks B(i,j) are set in each of the display regions 516, 517, 518, and 519. In an example shown in FIG. 14, 8 blocks B(i,j) and 6 blocks B(i,j) where i is 1 to 8 and j is 1 to are set horizontally (in the lateral direction of FIG. 14) and vertically (in the longitudinal direction of FIG. 14), respectively, in each of the display regions 516, 517, 518, and 519. That is, the display regions 516, 517, 518, and 519 are each divided into 8×6 (=48) blocks.

A touchscreen 52 is disposed on the display surface 51. Although not shown in FIG. 14, the touchscreen 52 is formed in such a manner that a first touch region 516a overlaps the first display region 516; a second touch region 517a overlaps the second display region 517; a third touch region 518a overlaps the third display region 518; and a fourth touch region 519a overlaps the fourth display region 519, as with the touchscreen 52 of FIG. 8. When the user presses any of the touch regions 516a, 517a, 518a, and 519a, the touch region detects that it has been pressed (touched) and outputs a detection signal indicating the pressed position (the pressed touch region) to the system control unit 70.

The first touch region 516a is divided into multiple touch regions P(i,j) corresponding to multiple blocks B(i,j). Similarly, the second touch region 517a, second touch region 518a, and fourth touch region 519a are each divided into multiple touch regions P(i,j) corresponding to multiple blocks B(i,j). When the user presses any of the touch region P(i,j), the touch region detects that it has been pressed (touched) and outputs a detection signal indicating the pressed position (pressed touch region) to the system control unit 70. In the display surface 51A shown in FIG. 14, elements similar to those in the display surface 51 shown in FIG. 8 are given the same reference signs and will not be described repeatedly.

Figure 15:
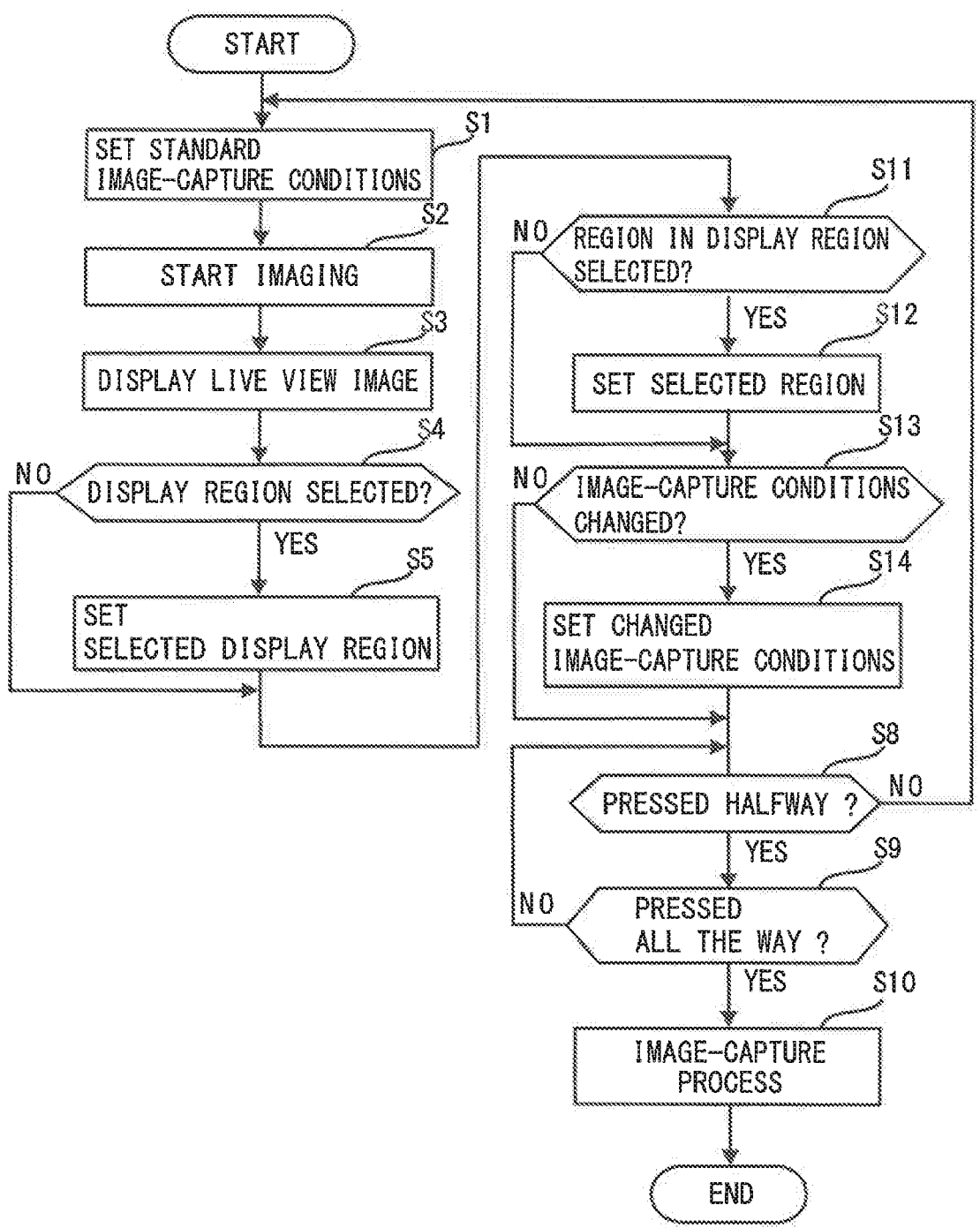
FIG. 15 is a flowchart showing an imaging operation performed by a system control unit according to the second embodiment.
Figure 16:
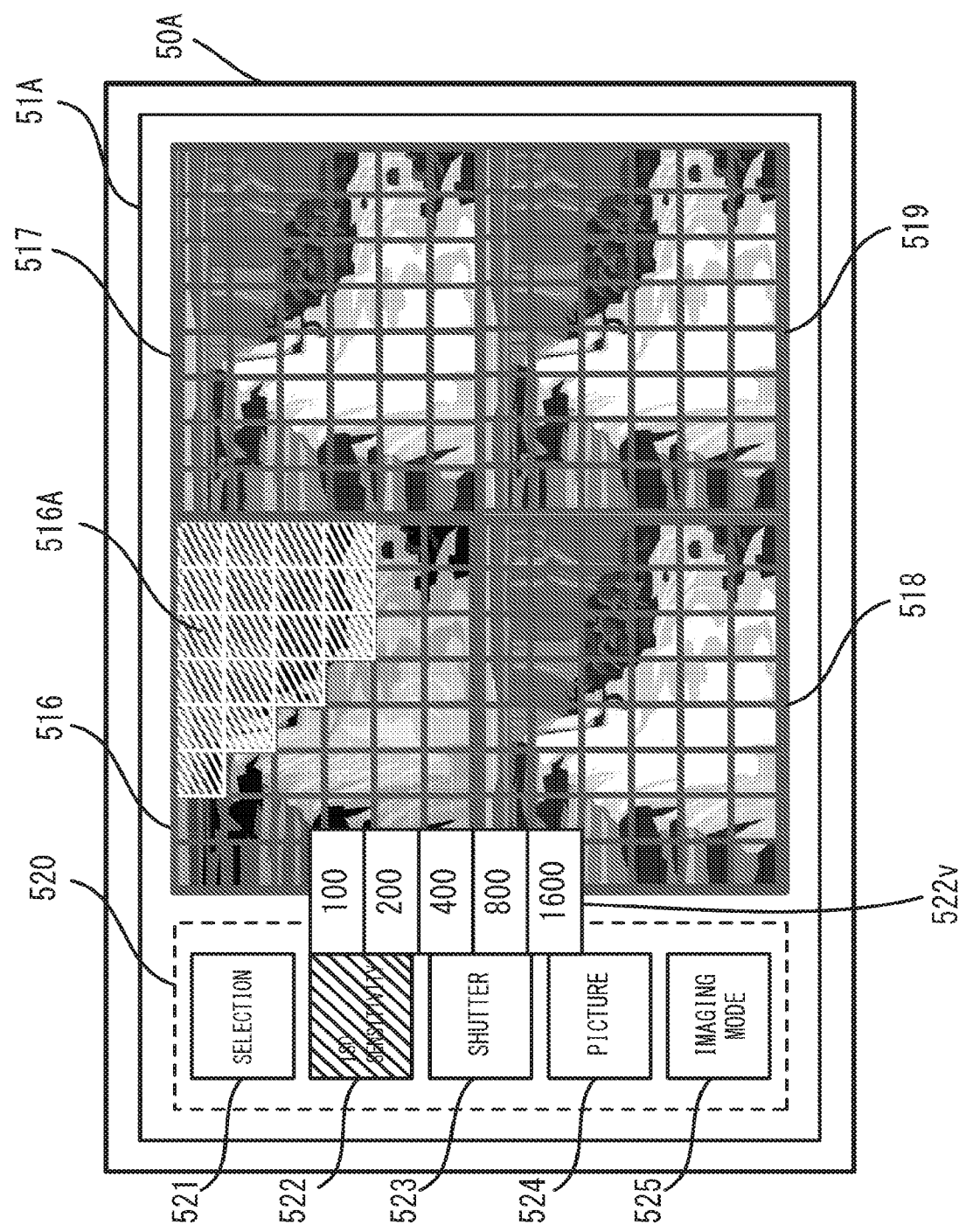
FIG. 16 is a drawing showing an example display of a display surface according to the second embodiment.
Figure 17:
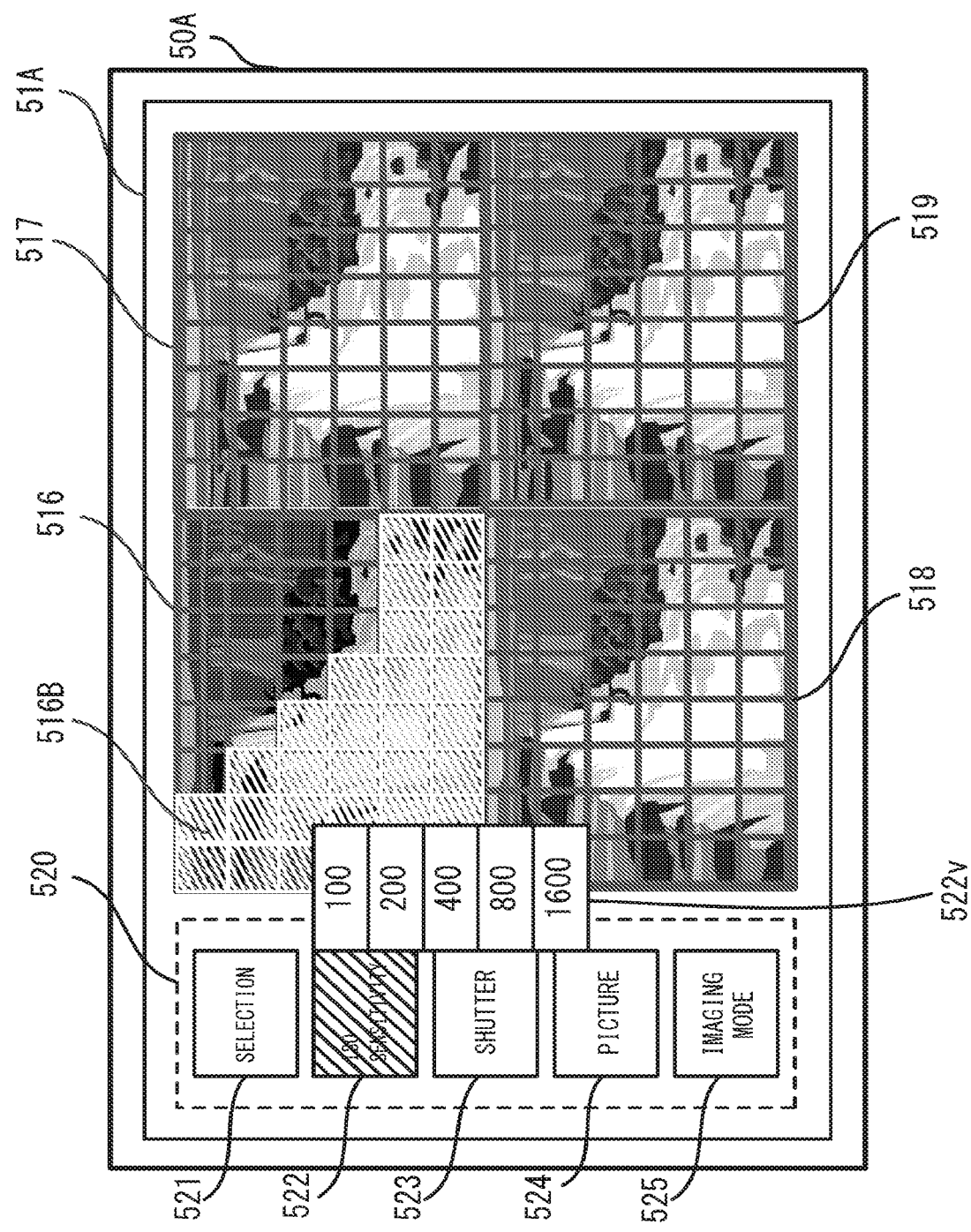
FIG. 17 is a drawing showing an example display of the display surface according to the second embodiment.

Next, an imaging operation of the digital camera 1 according to the second embodiment will be described. FIG. 15 is a flowchart showing an imaging operation performed by the system control unit 70 according to the second embodiment. FIGS. 16 to 17 are drawings each showing an example display of the display surface 51A according to the second embodiment. While the digital camera 1 can acquire both still images and moving images, a case where it acquires still images will be described below.

Steps S1 to S5 shown in FIG. 15 are similar to steps S1 to S5 shown in FIG. 9 and therefore will not be described repeatedly. After selecting one of the first display region 516, second display region 517, third display region 518, and fourth display region 519 (see steps S4, S5), the user can select a region in the selected display region. Specifically, the user selects a region in the display region in units of blocks by touching any blocks B(i,j) set in the display region with a finger (or sliding a finger on the blocks). The touchscreen 52 then outputs, to the system control unit 70, a detection signal corresponding to the touch region P(i,j) touched by the user.

Then, the selection unit 72 identifies the region selected by the user on the basis of the detection signal from the touchscreen 52. In the example shown in FIG. 16, the first display region 516 is selected by the user. Further, a region 516A in the first display region 516 is selected by the user. The region 516A is a region behind a waterfall (a region hatched with white lines in FIG. 16). Specifically, the region 516A includes blocks B(3,1), B(4,1), B(5,1), B(6,1), B(7,1), B(8,1), B(4,2), B(5,2), B(6,2), B(7,2), B(8,2), B(5,3), B(6,3), B(7,3), B(8,3), B(6,4), B(7,4), and B(8,4).

The selection unit 72 then determines whether the user has selected any region (step S11). If so, the selection unit 72 sets the region 516A selected by the user (step S12). Specifically, the selection unit 72 outputs, to the drive unit 21, a signal indicating the positions or the like of the blocks selected by the user.

The user can change the image-capture conditions of the selected display region (i.e., one of the first to fourth image-capture regions). The user also can change the image-capture conditions of the region in the selected display region. The setting unit 72 determines whether the user has made a change to any image-capture condition (step S14). If so, the selection unit 72 sets the changed image-capture condition (step S15).

For example, if the user wishes to set an ISO sensitivity as an image-capture condition for the region 516A of the first display region 516, he or she touches the ISO sensitivity button image 522 (i.e., touch region 522a). The touchscreen 52 then outputs, to the system control unit 70, a detection signal corresponding to the touch region 522a touched by the user. As shown in FIG. 16, the control unit 71 displays multiple ISO sensitivity values on a side of the ISO sensitivity button image 522. At this time, the setting unit 73 sets new touch regions on the touchscreen 52 in such a manner that the new touch regions overlap the ISO sensitivity values. The user then touches one of the ISO sensitivity values. The touchscreen 52 then outputs, to the system control unit 70, a detection signal corresponding to the touch region touched by the user. The setting unit 73 then sets the ISO sensitivity value touched by the user. Specifically, the setting unit 73 outputs, to the drive unit 21, a signal indicating a gain corresponding to the ISO sensitivity value selected by the user.

The drive unit 21 receives the signal indicating, in units of blocks, the first image-capture region corresponding to the region 516 selected by the user. The drive unit 21 also receives the signal indicating, in units of blocks, the region 516A in the first display region 516 selected by the user. The drive unit 21 also receives the signal indicating the image-capture condition selected by the user. The drive unit 21 then drives the image-capture unit 20 in such a manner that the image-capture unit 20 captures an image under the indicated image-capture condition (shutter speed, ISO sensitivity) in the blocks corresponding to the region 516A in the first display region 516. If the image processing unit 30 receives a signal indicating an image-capture condition selected by the user, it performs image processing on RAW data from a region corresponding to the region 516A under the indicated image-capture condition (control parameter such as white balance, gradation, or color tone correction). The lens drive control unit 15 adjusts the aperture diameter of the diaphragm 14 on the basis of the control information from the system control unit 70.

As seen above, when a change is made to an image-capture condition of the region corresponding to the region 516A in the pixel region 113A, a change is made to an image portion corresponding to the region 516A in the first live view image. For example, by increasing the ISO sensitivity, a bright image of the subject is captured even with a small amount of light. Further, dark portions of the region 516A are brightened. By increasing the shutter speed, blurring of the moving subject is reduced.

As seen above, the user can select one of the first display region 516, second display region 517, third display region 518, and fourth display region 519 and further selects a region in the selected display region. The user then sets an image-capture condition for the selected region. Thus, the user can check a change in the image portion corresponding to the predetermined region in the live view image corresponding to the change made to the image-capture condition.

Steps S1 to S5 and S11 to S14 described above are repeated until the user presses the release switch of the operation unit 55 halfway (step S8). While the case where the user selects the region 516A of the first display region 516 in FIG. 16 has been described, a similar process is performed when the user selects another region in the first display region 516. In the example shown in FIG. 17, a region 516B other than the region 516A in the image display region 516 is selected. In response to the user selecting the ISO sensitivity button image 522, shutter speed button image 523, picture control button image 524, or the like, a change occurs in the image portion displayed in the region 516B in the first display region 516.

Subsequently, steps S8 to S10 are performed. These steps are similar to those described with reference to FIG. 9 and therefore will not be described repeatedly.

While the still image acquisition operation has been described with reference to FIGS. 14 to 17, a moving image acquisition operation is also performed in the same way. In this case, moving images captured under different image-capture conditions (e.g., frame rate) in the image-capture regions (first to fourth image-capture regions) are displayed in the respective display regions (first display region 516, second display region 517, third display region 518, and fourth display region 519). At this time, a button for setting the frame rate is preferably displayed in the operation button display region 520. As with still images, the control unit 71 displays, in the entire image display region 510, moving images obtained by the main image capture in the pixel region (image-capture region) 113A.

In the second embodiment, as described above, the setting unit 73 sets image-capture conditions for some of the first or second image sensors in such a manner that the image-capture conditions differ from the first or second image-capture conditions. According to this configuration, it is possible to produce the effects of the first embodiment, as well as to make changes to image-capture conditions of each region in the first display region 516, second display region 517, third display region 518, and fourth display region 519. Accordingly, the user can make changes to image-capture conditions of each region and generate a changed image before acquiring a still image or moving images. Such a process can be said to be a pre-image-capture edit of an image.

Also in the second embodiment, the image-capture conditions which can be set for each region by the user are not limited to the ISO sensitivity, shutter speed, and picture. For example, the frame rate, thinning-out rate, the number of rows or columns whose pixel signals are summed up, the digitized bit number, and the like may also be set as image-capture conditions for each region. Parameters such as color signal processing, white balance adjustment, gradation adjustment, and compression rate may also be set as image-capture conditions for each region.

Third Embodiment

In the first and second embodiments, live view images are displayed in the four display regions of the single display unit 50. In a third embodiment, two live view images or still images are displayed on one of two display units, and a live view image obtained by combining the two live view images or still images is displayed on the other display unit.

Figure 18:
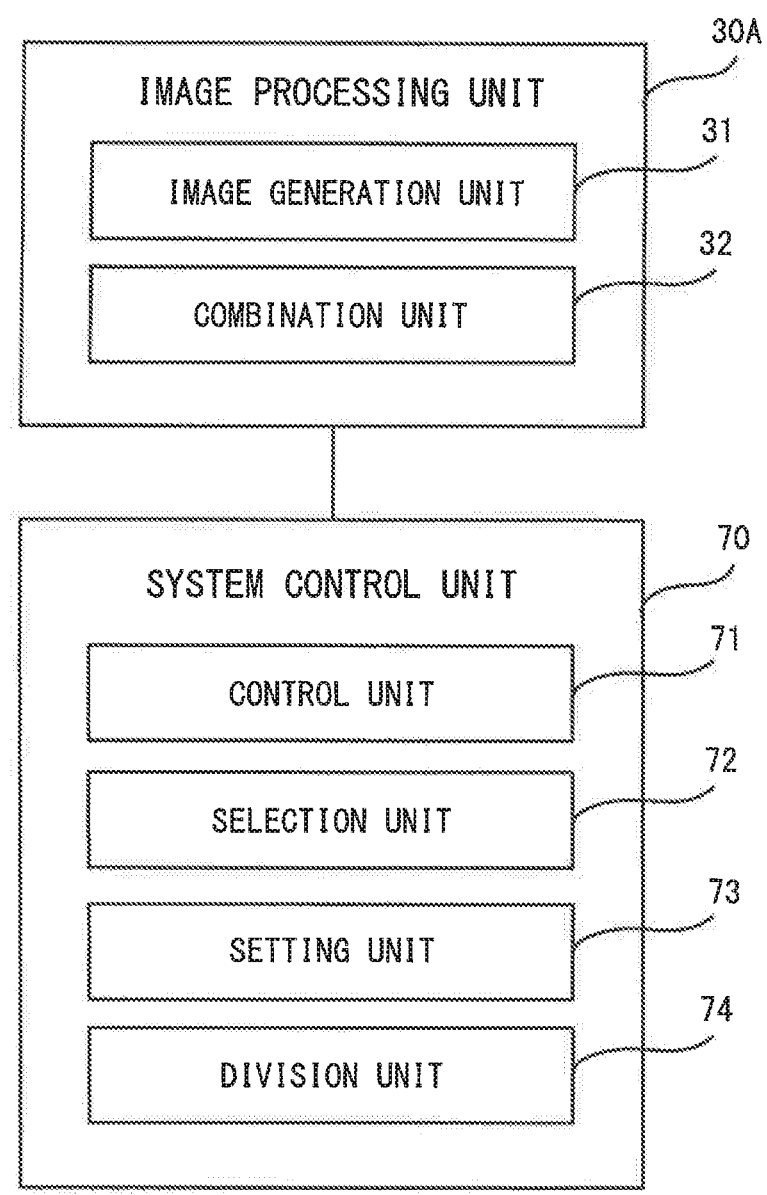
FIG. 18 is a function block diagram showing an image processing unit and a system control unit of a digital camera according to a third embodiment.

FIG. 18 is a function block diagram showing an image processing unit 30A and a system control unit 70 of a digital camera 1 according to the third embodiment. Note that FIG. 18 shows only elements corresponding to the image processing unit 30 and system control unit 70 of the elements shown in FIG. 7. As shown in FIG. 18, the image processing unit 30A includes an image generation unit 31, as well as a combination unit 32. The combination unit 32 combines image data of a first image-capture region and image data of a second image-capture region captured under different image-capture conditions. In the third embodiment, unlike in the first and second embodiments (the arrangement pattern shown in FIG. 5), only the first and second image-capture regions are set in a pixel region 113A. In this arrangement pattern, the first image-capture region includes blocks in odd rows (2n−1) in odd columns (2m−1) and blocks in even rows (2n) in even columns (2m). The second image-capture region includes blocks in odd rows (2n−1) in even columns (2m) and blocks in even rows (2n) in odd columns (2m−1). That is, a division unit 74 divides the pixel region 113A into blocks in such a manner that the blocks are checkered. As used herein, m and n are positive integers (m=1, 2, 3, . . . ; n=1, 2, 3, . . . ).

Figure 19:
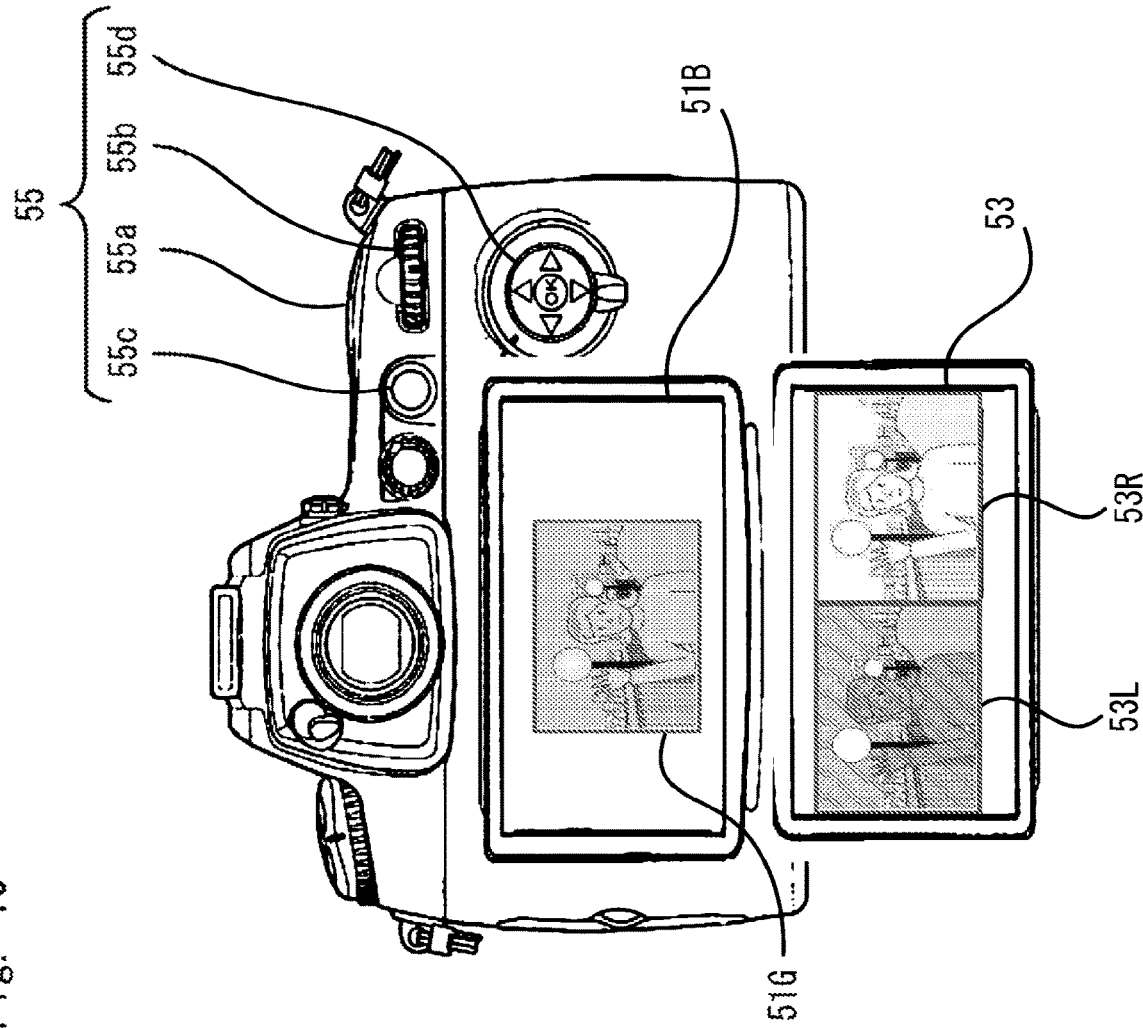
FIG. 19 is a drawing showing an example of images displayed on a first display unit and a second display unit according to the third embodiment.

FIG. 19 is a drawing showing an example of images displayed on a first display unit 50B and a second display unit 53 according to the third embodiment. While only the single display unit 50 is disposed in the first and second embodiments, the two display units (first display unit 50B and second display unit 53) are disposed in the third embodiment. Note that FIG. 19 shows the appearance of an electronic apparatus (digital camera) 1 seen from the back. As shown in FIG. 19, the first display unit 50B is a display panel having a rectangular display surface. The first display unit 50B is disposed on the back of the digital camera 1. Although not shown, a first touchscreen is formed on the display surface of the first display unit 50B.

The second display unit 53 is a display panel having a rectangular display surface. An edge of the second display unit 53 is rotatably coupled to the first display unit 50B through a hinge (not shown) disposed under the first display unit 50B on the back of the digital camera 1. Since the second display unit 53 rotates using the hinge as a pivot, the first display unit 50B is opened or closed by the second display unit 53.

A release switch 55a, a mode dial 55b, and a moving image switch 55c are disposed on the upper surface of the digital camera 1. The release switch 55a is a switch that the user presses to acquire a still image. By pressing the release switch 55a halfway, functions such as automatic focusing (AF) or automatic exposure (AE) are prepared. The mode dial 55b is a dial that the user rotates to set a scene mode such as portrait, landscape, or nightscape. The moving image switch 55c is a switch that the user presses to acquire moving images. Disposed on a side of the first display unit 50B on the back of the digital camera 1 is a multi-selector 55d. The multi-selector 55d includes upper, lower, left, and right arrow keys and OK switch that the user uses to select among menus (menus for setting the imaging mode) displayed on the first display unit 50B or second display unit 53. The release switch 55a, mode dial 55b, moving image switch 55c, and multi-selector 55d form an operation unit 55. Note that the operation unit 55 may include other switches or the like.

As shown in FIG. 19, a control unit 71 displays, in a left region 53L of the display surface of the second display unit 53, a live view image or still image (an image of a person captured at night) captured in the first image-capture region. The control unit 71 also displays, in a right region 53R of the display surface of the second display unit 53, a live view image or still image captured in the second image-capture region. The control unit 71 also displays, in a central region 51G of the first display unit 51, a live view image or still image obtained by combining the live view image or still image captured in the first image-capture region and the live view image or still image captured in the second image-capture region.

High dynamic range (HDR) imaging is widely known as an image combining technology for recording and displaying a wide-dynamic-range image. In HDR imaging, an image having less blown-out highlights or blocked-up shadows is generated by capturing multiple images while changing image-capture conditions (e.g., exposure) and then combining the multiple images. However, in traditional HDR, multiple images (e.g., two images) are captured under different image-capture conditions at different image-capture times and therefore the subject may move or the user (photographer) may move the digital camera 1. In this case, the multiple images are not images of the same subject and therefore are difficult to combine. In the third embodiment, on the other hand, two images (live view images or still images) can be captured under different image-capture conditions at the same (or approximately the same) image-capture time. This configuration according to the third embodiment can solve the problem with the traditional HDR imaging. Note that HDR mode is allowed to be selected, for example, in response to an operation of the multi-selector 55*d* by the user.

According to the above configuration, before capturing an image, the user can check the first live view image or still image captured in the first image-capture region and the second live view image or still image captured in the second image-capture region under different image-capture conditions. Further, before capturing an image, the user can check a wide-dynamic-range live view image or still image obtained by combining the first live view image or still image and the second live view image or still image.

In the third embodiment, the combination unit 32 generates wide-dynamic-range image data by combining image data captured in the first image-capture region and image data captured in the second image-capture region. However, other configurations may be employed. For example, the combination unit 32 may generate image data where the edge of the subject is enhanced, by combining image data captured in the first image-capture region and image data captured in the second image-capture region. Specifically, the setting unit 73 sets the shutter speed of the first image-capture region to 1/30 s and sets the shutter speed of the second image-capture region to 1/200 s. Thus, if the image sensor 100 captures an image of a fast-moving subject, image data where the subject is significantly blurred is generated in the first image-capture region of the image sensor 100. On the other hand, image data where the subject is blurred to a lesser extent is generated in the second image-capture region. The combination unit 32 then combines, with the data generated in the first image-capture region, data corresponding to the edge of the subject in the data generated in the second image-capture region. Thus, image data where the edge of the moving subject is enhanced can be obtained.

The control unit 71 displays a live view image or still image from the first image-capture region in the left region 53L of the display surface of the second display unit 53. The control unit 71 also displays a live view image or still image from the second image-capture region in the right region 53R of the display surface of the second display unit 53. The control unit 71 also displays, in a central region 51G of the first display unit 51, a live view image or still image obtained by combining the live view image or still image from the first image-capture region and the live view image or still image from the second image-capture region (a combined image where the edge of the subject is enhanced). According to this configuration, the user can check images captured at different shutter speeds, as well as an image obtained by combining such images.

Fourth Embodiment

In the first to third embodiments, the control unit 71 displays the first to fourth live view images in the first display region 511, second display region 512, third display region 513, and fourth display region 514, respectively, (or first display region 516, second display region 517, third display region 518, and fourth display region 519, respectively). In a fourth embodiment, on the other hand, a control unit 71 displays first to fourth moving images in the first to fourth display regions, respectively. A display unit displays the first to fourth moving images at respective refresh rates (the number of times refresh is performed per unit time) corresponding to the respective frame rates.

Figure 20:
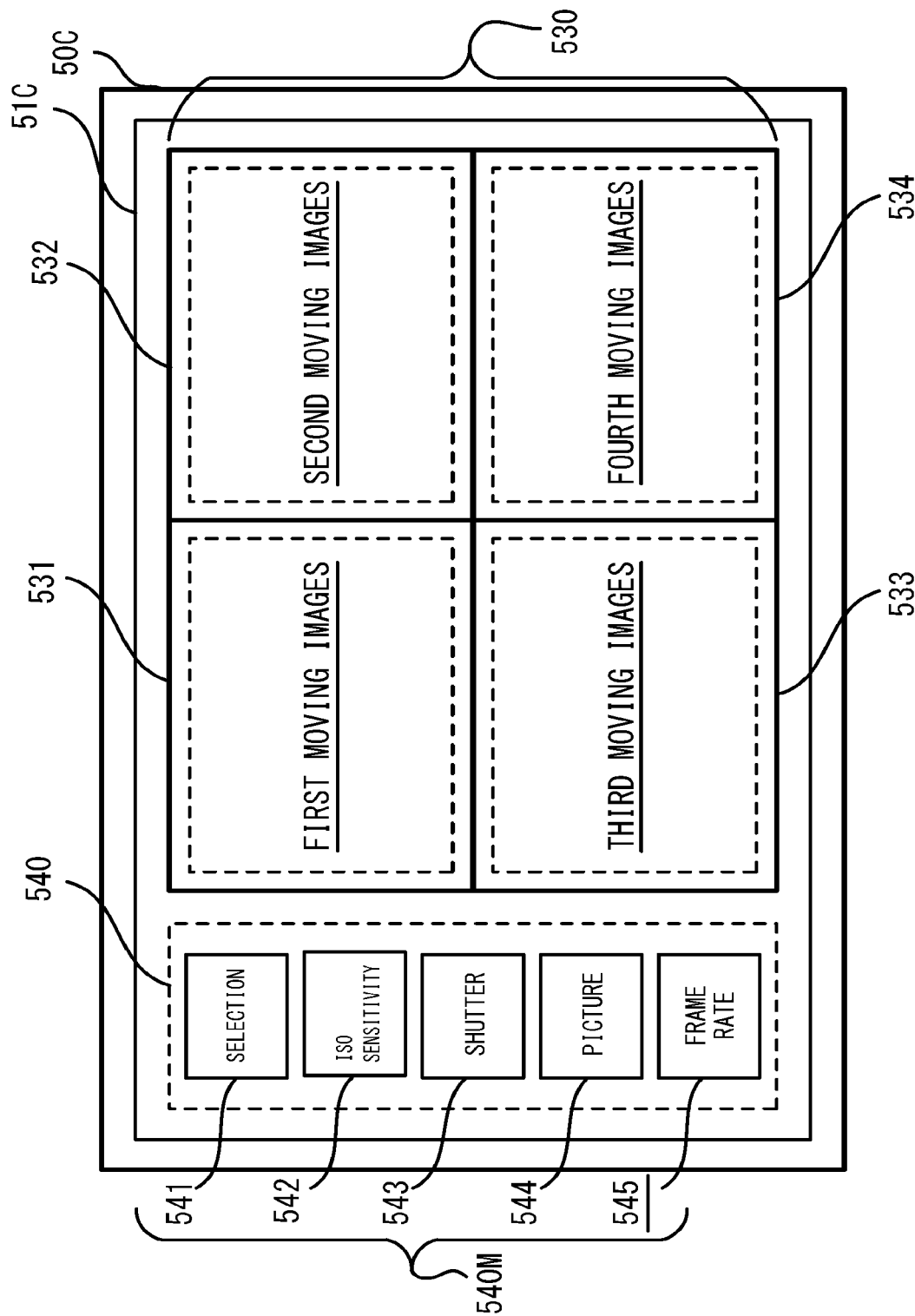
FIG. 20 is a drawing showing an example display of a display surface according to a fourth embodiment.

FIG. 20 is a drawing showing an example display of a display surface 51C according to the fourth embodiment. As shown in FIG. 20, a frame rate button image 545 for setting the frame rate is displayed in an operation button display region 540. The frame rate button image 545 is also included in a menu image 540M. A selection button image 541, an ISO sensitivity button image 542, a shutter speed button image 543, and a picture control button image 544 correspond to the selection button image 521, ISO sensitivity button image 522, shutter speed button image 523, and picture control button image 524, respectively, shown in FIG. 8 and the like. In the example display shown in FIG. 20, the frame rate button image 545 is disposed in place of the imaging mode button image 525 shown in FIG. 8 and the like. In the example shown in FIG. 20, the first display region 531, second display region 532, third display region 533, and fourth display region 534 correspond to the first display region 511, second display region 512, third display region 513, and fourth display region 514, respectively, shown in FIG. 8 and the like.

A setting unit 73 sets different frame rates for the first to fourth image-capture regions of the image sensor 100 in response to an operation of the frame rate button image 545 by the user, or automatically. For example, the setting unit 73 sets the frame rate of the first image-capture region to 30 fps, the frame rate of the second image-capture region to 60 fps, the frame rate of the third image-capture region to 90 fps, and the frame rate of the fourth image-capture region to 120 fps. Then, in response to an operation of the moving image switch by the user, the setting unit 73 causes the image sensor 100 to capture moving images at different frame rates in the first to fourth image-capture regions of the image sensor 100.

The control unit 71 then displays the moving images captured at the different frame rates in the first to fourth image-capture regions in the first display region 531, second display region 532, third display region 533, and fourth display region 534 of the image display region 530. Typically, a display unit including a liquid crystal display refreshes (updates) the image at the same refresh rate across the display surface. The display unit 50C according to the fourth embodiment, on the other hand, can refresh the image at different refresh rates in the first display region 531, second display region 532, third display region 533, and fourth display region 534 of the display surface 51C. Specifically, a drive circuit for driving the refresh of the pixels in the first display region 531, a drive circuit for driving the refresh of the pixels of the second display region 532, a drive circuit for driving the refresh of the pixels of the third display region 533, and a drive circuit for driving the refresh of the pixels of the fourth display region 534 are separately disposed on the display surface 51C of the display unit 50C. According to this configuration, the user can easily recognize the differences among the multiple sets of moving images captured at different refresh rates.

Further, the control unit 71 separately records, in the recording unit 60, respective sets of image data of the first to fourth moving images captured at the different frame rates in the first to fourth image-capture regions of the image sensor 100. According to this configuration, the respective sets of image data of the multiple sets of moving images captured at the different refresh rates can be simultaneously recorded in the recording unit 60.

In the first to third embodiments, the control unit 71 displays, in the first to fourth display regions of the display surface, live view images or moving images captured under different image-capture conditions (shutter speed, frame rate, or the like). However, it may display, in the first to fourth display regions of the display surface, still images captured under different image-capture conditions. In this case, the control unit 71 displays first to fourth still images captured based on a single operation of the release switch by the user, in the first to fourth display regions, respectively. According to this configuration, the user can easily recognize the differences among the multiple still images captured at the different image-capture conditions.

Fifth Embodiment

In a fifth embodiment, when the user zooms in an image using an electronic zoom (also called a digital zoom) in one of the first to fourth display regions, a system control unit 70 zooms in images in the other display regions in accordance with the zoom-in of the image.

If the user wishes to zoom in an image using an electronic zoom, he or she, for example, touches the touchscreen on the display surface. In response, the control unit 71 outputs, to an image processing unit 30, a signal indicating a region to be cut out from the image. The image processing unit 30 then cuts off (trims) image data of the region indicated by the system control unit 70. The control unit 71 then outputs the image data of the region cut out by the image processing unit 30 to the display unit to cause the display unit to zoom in an image based on the image data of the region on the display surface of the display unit.

Figure 21:
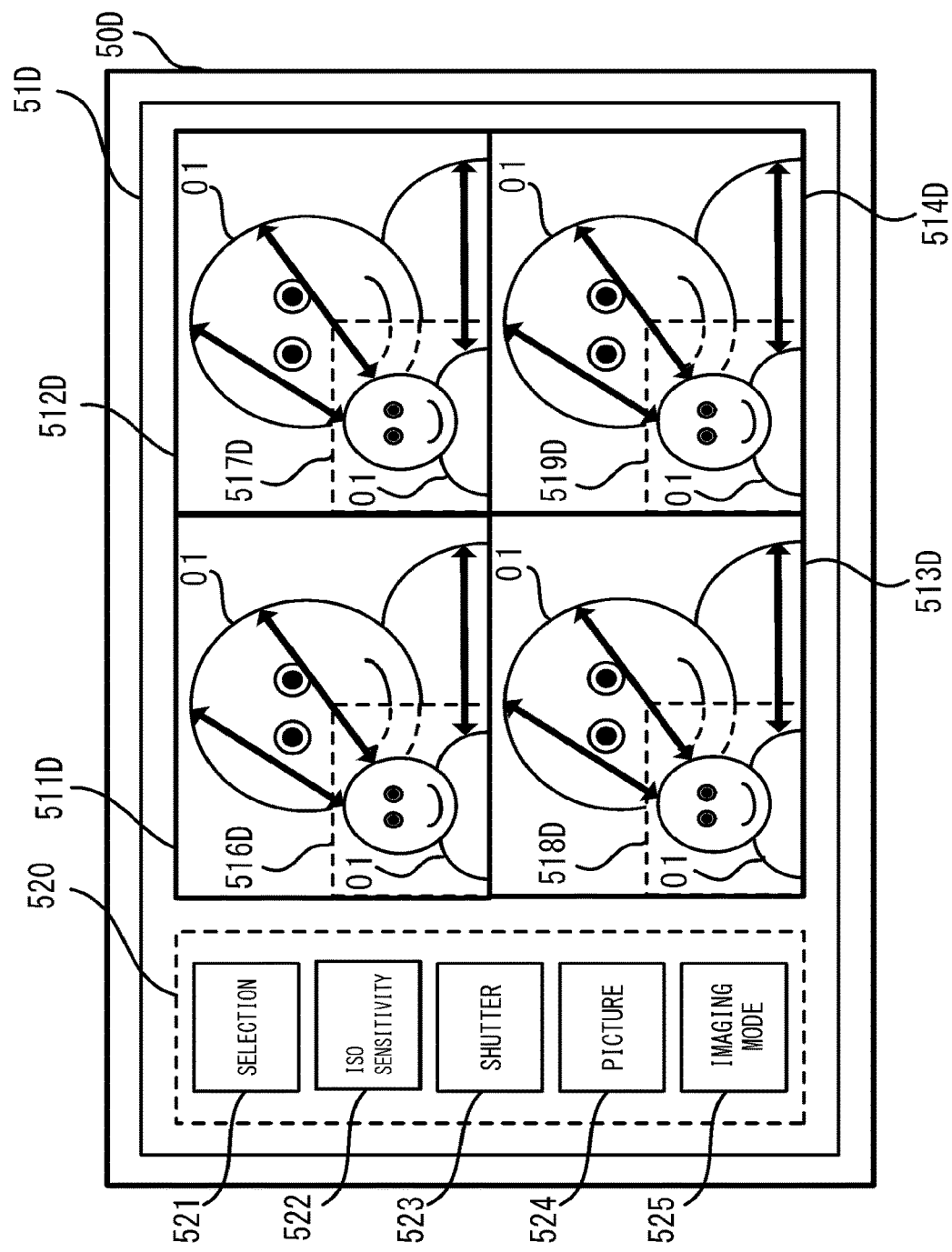
FIG. 21 is a drawing showing an example display of a display surface 51D when an electronic zoom is performed according to a fifth embodiment.

FIG. 21 is a drawing showing an example display of a display surface 51D when an electronic zoom is performed according to the fifth embodiment. In the example display of the display unit 50D shown in FIG. 21, a first display region 511D, a second display region 512D, a third display region 513D, and a fourth display region 514D correspond to the first display region 511, second display region 512, third display region 513, and fourth display region 514, respectively, shown in FIG. 8 and the like. An operation button display region 520 is similar to those shown in FIG. 8 and like and therefore will not be described repeatedly.

For example, as shown in FIG. 21, the user selects a region 516D in the first display region 511D by touching a touchscreen formed on the first display region 511D, in order to zoom in a portrait image O1 displayed in the region 516D using an electronic zoom. In response to such an operation, the control unit 71 zooms in the portrait image O1 displayed in the region 516D of the first display region 511D across the first display region 511D. The control unit 71 also zooms in portrait images O1 in the second display region 512D, third display region 513D, and fourth display region 514D at the same display magnification as that at which the portrait image O1 in the first display region 511D has been zoomed in. Specifically, the control unit 71 zooms in, across the second display region 512D, a portrait image O1 displayed in a region 517D of the second display region 512D. The control unit 71 also zooms in, across the third display region 513D, a portrait image O1 displayed in a region 518D of the third display region 513D. The control unit 71 also zooms in, across the fourth display region 514D, a portrait image O1 displayed in a region 519D of the fourth display region 514D.

Further, when the user zooms out an image using the electronic zoom in one of the first display region 511D, second display region 512D, third display region 513D, and fourth display region 514D, the control unit 71 can zoom out images in the other display regions in accordance with the zoom-out of the image. For example, as shown in FIG. 21, the user selects the entire first display region 511D by touching the touchscreen formed thereon, in order to zoom out a portrait image O1 displayed across the first display region 511D using the electronic zoom. In response to such an operation, the control unit 71 zooms out, in the region 516D of the first display region 511D, the portrait image O1 displayed across the first display region 511D. The control unit 71 also zooms out portrait images O1 in the second display region 512D, third display region 513D, and fourth display region 514D at the same display magnification as that at which the portrait image O1 in the first display region 511D has been zoomed out.

As described above, when the user zooms in or out one of a first image (e.g., the portrait image O1 displayed in the first display region 511D) and a second image (e.g., the portrait image O1 displayed in the second display region 512D), the control unit 71 of the fifth embodiment zooms in or out the other image in accordance with the zoom-in or zoom-out of the one image. According to this configuration, when the user zooms in or out an image using the electronic zoom, he or she can equalize the sizes of the images displayed in the respective display regions and thus easily recognize the differences among the images resulting from the differences among the image-capture conditions. Further, the user does not need to zoom in or out the respective images, that is, the operation of the user does not increase.

The fifth embodiment is applicable to the case where the user performs the electronic zoom by touching the touchscreen, as well as to a case where the user performs the electronic zoom by operating, for example, an electronic zoom switch (i.e., a switch operated to perform the electronic zoom) of the operation unit 55.

Sixth Embodiment

Figure 22:
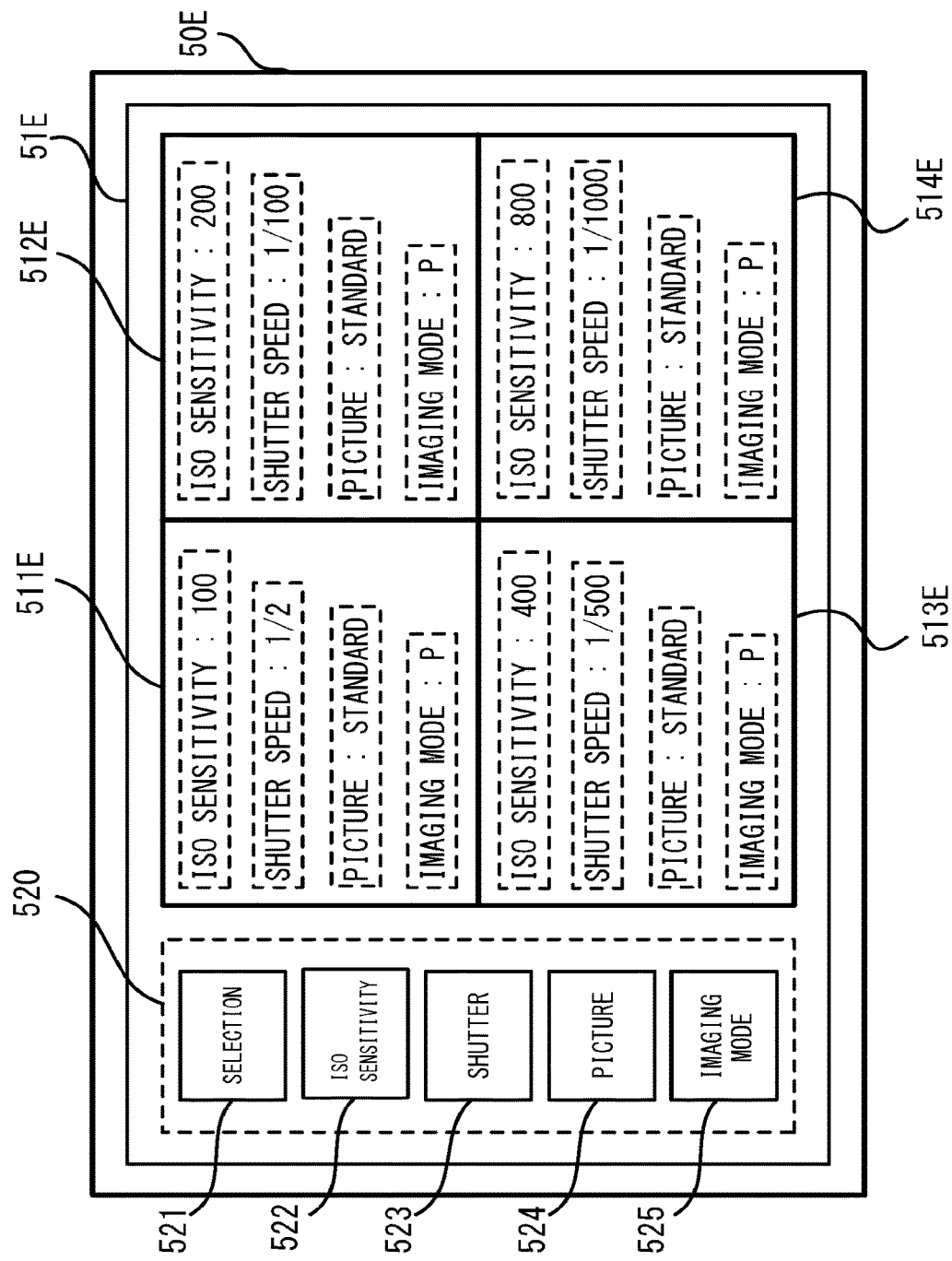
FIG. 22 is a drawing showing an example display of a display surface according to a sixth embodiment.

FIG. 22 is a drawing showing an example display of a display surface 51E according to a sixth embodiment. In the example display of the display unit 50E shown in FIG. 22, a first display region 511E, a second display region 512E, a third display region 513E, and a fourth display region 514E correspond to the first display region 511, second display region 512, third display region 513, and fourth display region 514, respectively, shown in FIG. 8 and the like. An operation button display region 520 is similar to those shown in FIG. 8 and like and therefore will not be described repeatedly.

As shown in FIG. 22, a control unit 71 displays first to fourth images and the image-capture conditions thereof in the first display region 511E, second display region 512E, third display region 513E, and fourth display region 514E, respectively, in such a manner that the respective image-capture conditions are overlaid on the first to fourth images. In the example shown in FIG. 22, the image-capture conditions of the first image are set as follows:

ISO sensitivity="100"; shutter speed="½ s"; picture control="standard"; and imaging mode="P." The image-capture conditions of the second image are set as follows: ISO sensitivity="200"; shutter speed="1/100 s"; picture control="standard"; and imaging mode="P." The image-capture conditions of the third image are set as follows: ISO sensitivity="400"; shutter speed="1/500 s"; picture control="standard"; and imaging mode="P." The image-capture conditions of the fourth image are set as follows: ISO sensitivity="800"; shutter speed="1/1000 s"; picture control="standard"; and imaging mode="P." According to this configuration, the user can easily check the image-capture conditions currently set in each display region.

As an alternative, an image-capture condition display region for displaying the image-capture conditions currently set in the display region (e.g., first display region) selected by the user may be disposed on a lower portion of the display surface of the display unit. As another alternative, the control unit 71 may display the image-capture conditions only for a predetermined time. An yet another alternative, the following configuration may be used: a switch for making a selection as to whether to display the image-capture conditions (a switch in the operation unit 55 or a switch on the touchscreen) is provided; and the control unit 71 switches between display and non-display of the image-capture conditions in an image-capture conditions display region 550 in response to an operation of this switch.

Seventh Embodiment

Figure 10:
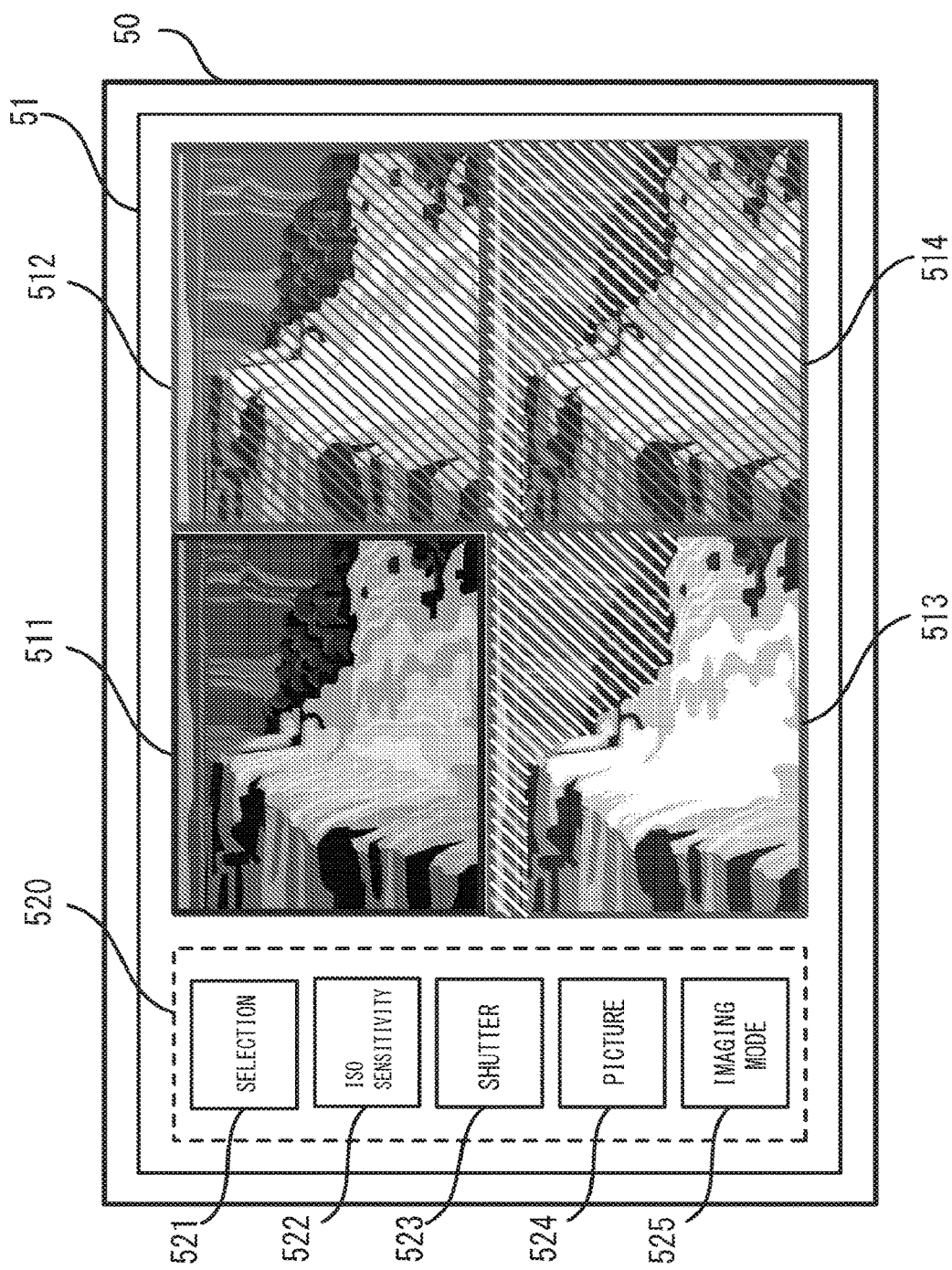
FIG. 10 is a drawing showing an example display of a display surface according to the first embodiment.

In the operation button display region 520 shown in FIG. 10 and the like, the buttons 521, 522, 523, 524, and 525 are arranged in a predetermined order. That is, the selection button image 521 is placed in the highest position; the ISO sensitivity button image 522 in the second highest position (i.e., under the selection button image 521); the shutter speed button image 523 in the third highest position (i.e., under the ISO sensitivity button image 522); the picture control button image 524 in the fourth highest position (i.e., under the shutter speed button image 523); and the imaging mode button image 525 in the lowest position. In a seventh embodiment, on the other hand, a control unit 71 changes the arrangement of the displayed buttons 521 to 525 in accordance with the subject in the display region. Further, in the seventh embodiment, the control unit 71 displays a button having higher priority with a different appearance from that of the other buttons.

Figure 23:
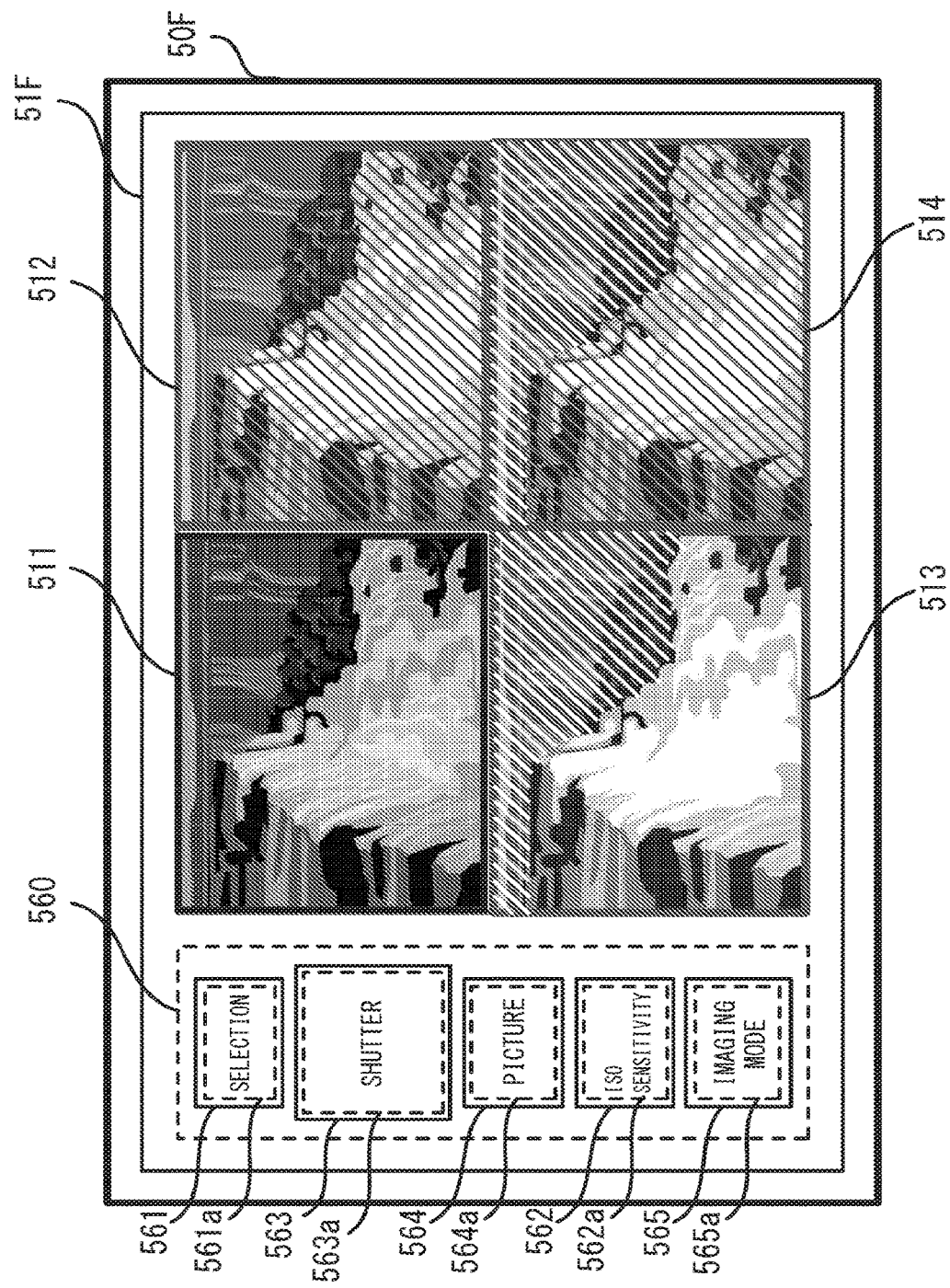
FIG. 23 is a drawing showing an example display of a display surface according to a seventh embodiment.

FIG. 23 is a drawing showing an example display of a display surface 51F according to the seventh embodiment. In the example display of the display unit 50F shown in FIG. 23, a selection button image 521 is placed in the highest position; a shutter speed button image 523 in the second highest position (i.e., under the selection button image 521); a picture control button image 524 in the third highest position (i.e., under the shutter speed button image 523); an ISO sensitivity button image 522 in the fourth highest position (i.e., under the picture control button image 524); and an imaging mode button image 525 in the lowest position. As shown in FIG. 23, the shutter speed button image 523 is larger than the other buttons (selection button image 521, ISO sensitivity button image 522, picture control button image 524, imaging mode button image 525).

A touchscreen 52 is formed in such a manner that a touch region 521a overlaps the selection button image 521; a touch region 523a overlaps the shutter speed button image 523; a touch region 524a overlaps the picture control button image 524; a touch region 522a overlaps the ISO sensitivity button image 522; and a touch region 525a overlaps the imaging mode button image 525. The touch region 523a, whose size matches that of the shutter speed button image 523, is larger than the other buttons.

Next, a process of changing the arrangement of the buttons 521 to 525 performed by an image processing unit 30 and a system control unit 70 will be described. When the user makes changes to image-capture conditions, the system control unit 70 instructs the image processing unit 30 to detect a moving subject. The image processing unit 30 then detects a moving subject and a non-moving subject by making comparison among multiple sets of image data chronologically obtained from live view images. The image processing unit 30 then outputs the detection result along with the image data to the system control unit 70.

The control unit 71 determines whether any moving subject is included in a display region selected by a selection unit 72, on the basis of the detection result from the image processing unit 30. If so, the control unit 71 displays the shutter speed button image 523, which is a button for setting the shutter speed, in the second highest position, as shown in FIG. 23. At this time, the control unit 71 displays the shutter speed button image 523 in such a manner that the shutter speed button image is larger than the other buttons.

When the shutter speed is changed, the way the moving subject is displayed is changed. For example, assuming that the moving subject is a waterfall, when the shutter speed is increased, the image appears as if the flow of the waterfall stopped momentarily. In contrast, when the shutter speed is reduced, the image appears as if the flow of the waterfall were a thread. As seen above, for a moving subject, the shutter speed more significantly influences the way the moving subject is displayed than the other image-capture conditions. Accordingly, when a moving subject is included in the region, the control unit 71 determines that the shutter speed has higher priority than the other image-capture conditions. The control unit 71 then moves the position of the shutter speed button image 523 upward, as well as displays the shutter speed button image 523 as a larger button. Thus, the button having higher priority is placed in a position in which the user can easily operate the button, thereby increasing the usability. Further, the button (i.e., image-capture condition) having higher priority becomes more conspicuous than the other buttons (i.e., image-capture conditions). Thus, the user can be urged to operate the button having higher priority.

In the example described above, the control unit 71 changes the arrangement and appearance (size) of the buttons on the basis of whether a subject in a region is a moving subject. However, other configurations may be employed. For example, the system control unit 70 instructs the image processing unit 30 to detect the brightness of the image portion in the region. The image processing unit 30 then detects the brightness of the image portion in the region on the basis of a corresponding live view image portion. The image processing unit 30 then outputs the detection result along with the image data to the system control unit 70.

The control unit 71 then determines whether the brightness of the image portion in the region selected by the selection unit 72 falls within a predetermined range, on the basis of the detection result from the image processing unit 30. If not so, the control unit 71 displays the ISO sensitivity button image 522, which is a button for setting the ISO sensitivity, in the second highest place. At this time, the control unit 71 displays the ISO sensitivity button image 522 in such a manner that the ISO sensitivity button is larger than the other buttons.

By changing the ISO sensitivity, the dark part of the live view image is brightened, and the bright part thereof is darkened. If the brightness in the region does not fall within the predetermined range, that is, if the image portion in the region is too bright or too dark, it is possible to bring the exposure close to the optimum exposure by changing the ISO sensitivity. Accordingly, if the brightness of the image portion in the region does not fall within the predetermined range, the control unit 71 determines that the ISO sensitivity has higher priority than the other image-capture conditions. The control unit then moves the position of the ISO sensitivity button image 522 upward, as well as displays the ISO sensitivity button image 522 as a larger button. Thus, the button having higher priority is placed in a position in which the user can easily operate the button, thereby increasing the usability. Further, the button (i.e., image-capture condition) having higher priority becomes more conspicuous than the other buttons (i.e., image-capture conditions). Thus, the user can be urged to operate the button having higher priority.

Methods for displaying a button having higher priority conspicuously include the enlargement of the button, as well as change of the button color and blinking of the button. A button having higher priority may be made conspicuous by displaying multiple image-capture condition values on a side of the button before the user presses the button. Only the arrangement of the buttons may be changed, or only the appearance of the buttons may be changed.

The arrangement and appearance of the buttons may also be changed according to the order in which the user operates the buttons. For example, assume that the user presses the selection button image 521, then selects a display region, then presses the imaging mode button image 525, selects manual mode as the imaging mode, and then makes changes to image-capture conditions of each display region. In this case, the control unit 71 places the selection button image 521 in the highest position, as well as enlarges it. The control unit 71 then places the imaging mode button image 525 in the highest position, as well as enlarges it. Then, the control unit 71 places one of the ISO sensitivity button image 522, shutter speed button image 523, and picture control button image 524 in the highest place and enlarges it in accordance with the subject (image) in each display region. By changing the arrangement and appearance of the buttons in accordance with the order in which the user operates the buttons, as described above, user convenience is improved.

Eighth Embodiment

Generally, causing the strobe to emit light at the same time that the shutter curtain fully opens is called first curtain synchronization. On the other hand, causing the strobe to emit light immediately before the shutter curtain starts to close is called second curtain synchronization. In the eighth embodiment, a setting unit 73 sets a slow shutter speed (e.g., ½ s) for the first and second image-capture regions. The system control unit also causes the strobe 90 to emit light immediately before charge accumulation ends in the first image-capture region. That is, images are captured in the first image-capture region using second curtain synchronization. The system control unit 70 also causes the strobe 90 to emit light at the same time that charge accumulation starts in the second image-capture region. That is, images are captured in the second image-capture region using first curtain synchronization.

Figure 24:
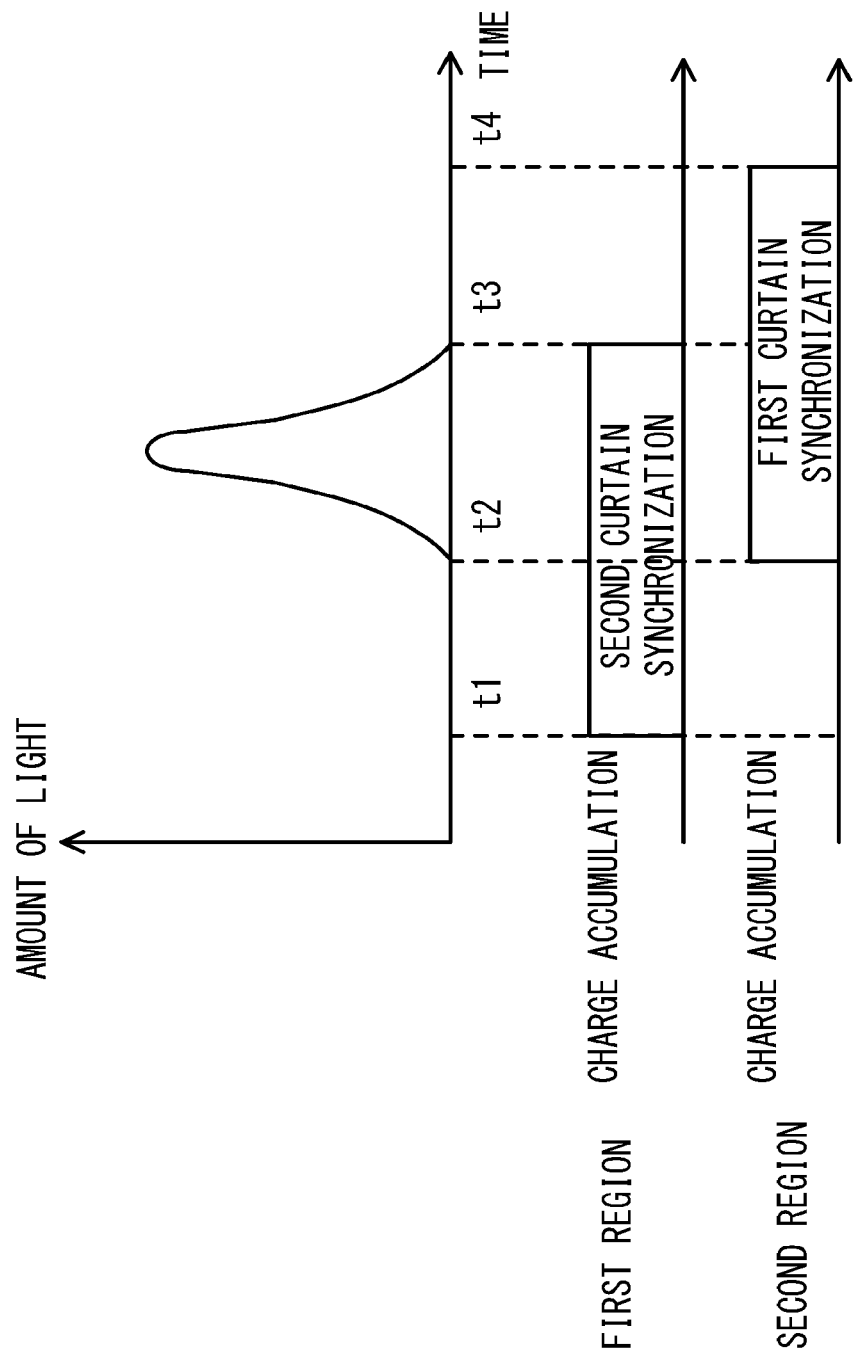
FIG. 24 is a timing chart showing the timing of light emission of a strobe and the timing of charge accumulation according to an eighth embodiment.

FIG. 24 is a timing chart showing the timing of light emission of the strobe 90 and the timing of charge accumulation according to the eighth embodiment. As shown in FIG. 24, the setting unit 73 accumulates charge in the first image-capture region over a period from timing t1, preceding timing t2 when the strobe 90 starts to emit light, to timing t3 when the amount of light emitted by the strobe 90 is lost. The setting unit 73 also accumulates charge in the second image-capture region over a period from timing t2 when the strobe 90 starts to emit light to timing t4, following the timing t3 when the amount of light emitted by the strobe 90 is lost. The control unit 71 then displays, in the first display region 511, a first image based on image data generated in the first image-capture region and displays, in the second display region 512, a second image based on image data generated in the second image-capture region.

Thus, the user can previously check the difference between the first image captured using second curtain synchronization and the second image captured using first curtain synchronization. When first curtain synchronization is used, for example, the afterimage and light trace of an automobile and the light thereof, which are the subjects, are left in front of the automobile. Thus, there is obtained an image as if the automobile were moving backward though it were moving forward. On the other hand, when second curtain synchronization is used, there is obtained an image where the afterimage and light trace of an automobile and the light thereof appear behind the automobile naturally.

Ninth Embodiment

A ninth embodiment provides a configuration where the digital camera 1 according to the first embodiment is divided into an image-capture device 1A and an electronic apparatus 1B.

Figure 25:
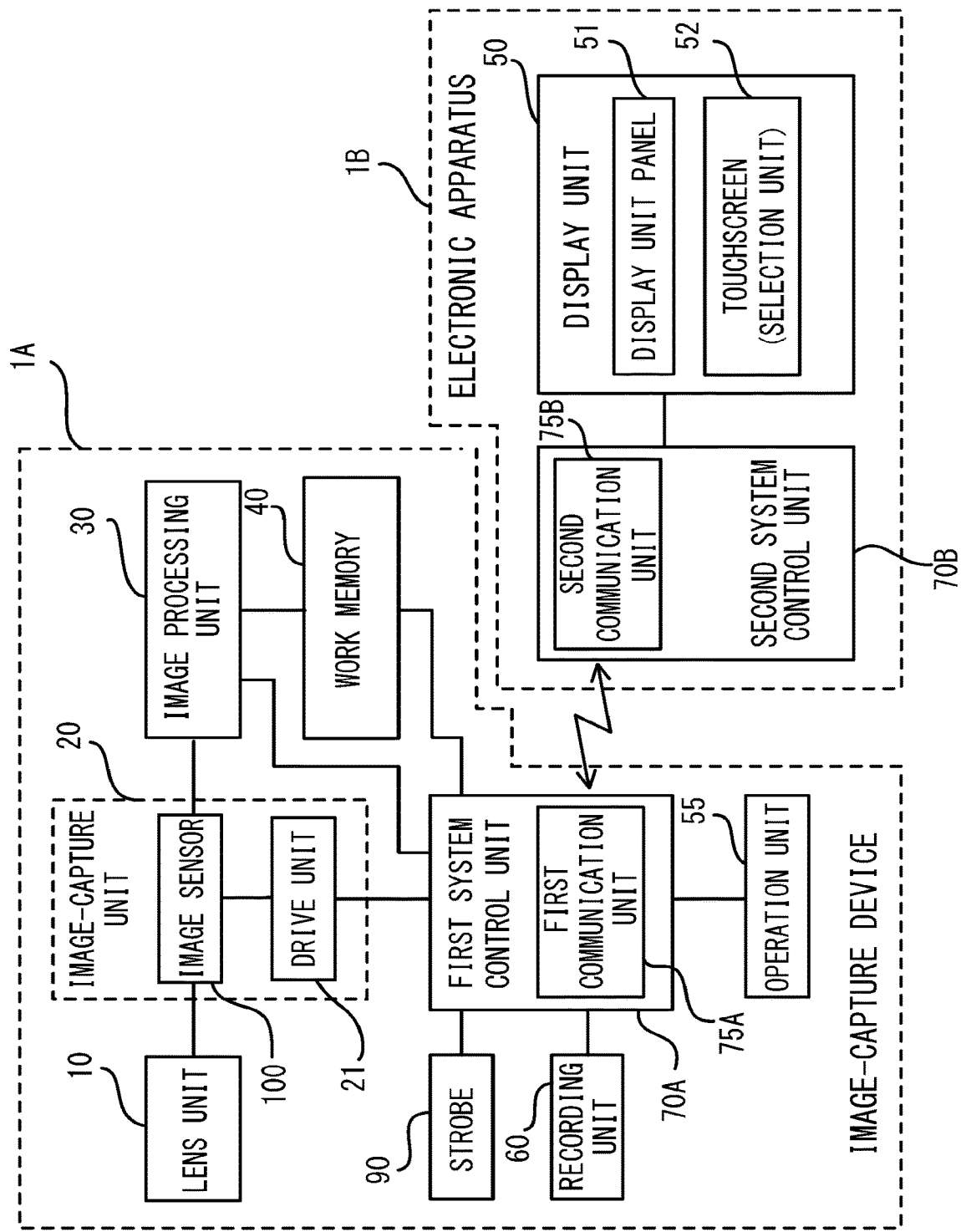
FIG. 25 is a block diagram showing the configuration of an image-capture device and an electronic apparatus according to a ninth embodiment.

FIG. 25 is a block diagram showing the configuration of the image-capture device 1A and electronic apparatus 1B according to the ninth embodiment. In the configuration shown in FIG. 25, the imaging device 1A captures images of subjects. The imaging device 1A includes a lens unit 10, an image-capture unit 20, an image processing unit 30, a work memory 40, an operation unit 55, a recording unit 60, and a first system control unit 70A. The lens unit 10, image-capture unit 20, image processing unit 30, work memory 40, operation unit 55, and recording unit 60 in the imaging device 1A are similar to those shown in FIG. 7 and therefore will not be described repeatedly.

The electronic apparatus 1B displays images (still images, moving images, live view images). The electronic apparatus 1B includes a display unit 50 and a second system control unit (control unit) 70B. The display unit 50 of the electronic apparatus 1B is similar to that shown in FIG. 7 and therefore will not be described repeatedly.

The first system control unit 70A includes a first communication unit 75A. The second system control unit 70B includes a second communication unit 75B. The first communication unit 75A and second communication unit 75B transmit or receive signals to or from each other by wire or wirelessly. In this configuration, the first system control unit 70A transmits image data (image data processed by the image processing unit 30, image data recorded in the recording unit 60) to the second communication unit 75B through the first communication unit 75A. The second system control unit 70B causes the display unit 50 to display the image data received by the second communication unit 75B. The system control unit 70B also causes a second display unit 53 to display a preset menu image.

The system control unit 70B also make changes to image-capture conditions (including accumulation conditions) in response to a touch on a touchscreen 52 by the user, or automatically. The system control unit 70B also selects a display region in an image display region 510 in response to a touch on the touchscreen 52 by the user, or automatically. The first system control unit 70A controls image capture in response to an operation of the operation unit 55 (an operation unit disposed on the electronic apparatus 1B and configured to request the start of acquisition of still images or moving images) by the user.

The elements shown in FIG. 7 (control unit 71, selection unit 72, setting unit 73, and division unit 74) may be disposed in any of the first system control unit 70A and second system control unit 70B. All the elements shown in FIG. 7 may be disposed in one of the first system control unit 70A and second system control unit 70B. Some of the elements shown in FIG. 7 may be disposed in the first system control unit 70A, and the other elements may be disposed in the system control unit 70B.

Examples of the image-capture device 1A include digital cameras, smartphones, mobile phones, and personal computers which each have image-capture and communication functions. Examples of the electronic apparatus 1B include smartphones, mobile phones, and portable personal computers which each have a communication function.

The first system control unit 70A shown in FIG. 25 is implemented when a body-side CPU performs processing on the basis of a control program. The second system control unit 70B shown in FIG. 25 is also implemented when the body-side CPU performs processing on the basis of the control program.

As seen above, the ninth embodiment produces the effects described in the first embodiment, as well as allows the user to check multiple live view images being captured by the image-capture device 1A using a mobile terminal such as a smartphone before capture an image.

In the configuration shown in FIG. 25, the image processing unit 30 and first system control unit 70A may be integral with each other. In this case, a system control unit including one body-side CPU serves as the image processing unit 30 and first system control unit 70A when it performs processing on the basis of a control program.

While the present invention has been described using the embodiments, the technical scope of the invention is not limited to the scope described in the embodiments. Various changes or modifications can be made to the embodiments without departing from the spirit and scope of the invention. One or more of the elements described in the embodiments may be omitted. Forms resulting from such changes, modifications, or omission are also included in the technical scope of the invention. Elements of the embodiments or modifications may be combined as appropriate and used.

For example, while the color filters 102 form Bayer arrays in the embodiments, they may form other types of arrays. Each unit group 131 only has to include at least one pixel. Each block only has to include at least one pixel. Thus, it is also possible to capture an image under image-capture conditions which vary among the pixels.

In the embodiments, part or all of the drive unit 21 may be included in the image-capture chip 113 or signal processing chip 111. Part of the image processing unit 30 may be included in the image-capture chip 113 or signal processing chip 111. Part of the system control unit 70 may be included in the image-capture chip 113 or signal processing chip 111.

Further, while the user selects a display region and then makes changes to image-capture conditions (including accumulation conditions) thereof in the embodiments, the user may first makes changes to image-capture conditions and then select a display region in which the changed image-capture conditions are reflected. In the first and second embodiments, the control unit 71 may delete, from the display panel 51, a display region (live view image) selected by the user of the four display regions in the display panel 51. According to this configuration, the user can delete a live view image captured under image-capture conditions under which the user does not wish to capture an image and thus can easily make comparison among live view images desired by the user. If the control unit 71 deletes a display region (live view image) selected by the user from the display panel 51, it may display a live view image generated by the combination unit 32 in the space corresponding to the deleted display region.

In the embodiments, in response to one full press, the image-capture unit 20 captures an image in the entire pixel region 113A (all pixels) under the image-capture conditions of the display region selected by the user. However, other configurations may be employed. For example, in response to one full press, the image-capture unit 20 may capture an image in one divided region (e.g., first image-capture region) of the pixel region 113A under the image-capture conditions of the display region selected by the user. There may be also employed a configuration where the user can select two or more display regions. In this case, in response to one full press, the image-capture unit 20 may simultaneously capture images in two or more divided regions (e.g., first and second image-capture regions) of the pixel region 113A under the respective image-capture conditions of two or more display regions selected by the user.

As shown in FIG. 5, the image-capture regions in the pixel region 113A each include different multiple blocks. Accordingly, the image generation unit 31 may generate one live view image with respect to all the pixels in the pixel region 113A by stacking live view images captured in the respective image-capture regions. At this time, the control unit 71 may display such a live view image generated by the image generation unit 31 on the display panel 51 (image display region 510). While the display regions 511, 512, 513, and 514 (or display regions 516, 517, 518, and 519) in the image display region 510 have the same area, the display regions may have different areas.

While the operation button display region 520 is located near the image display region 510 in the embodiments, it may be located in a position which is not near the image display region 510. The operation button display region 520 may also be located in a position which is superimposed on the image display region 510. The user may operate the operation unit 55 rather than touching the touchscreen 52.

In the embodiments, it is assumed that the image-capture conditions of a live view image selected by the user are the same as the image-capture conditions of an image acquired in response to a full press of the release switch or the like. This is intended to ensure that an image to be actually acquired can be checked using a live view image. However, the image-capture conditions of a live view image may be different from those of an image to be actually acquired. In this case, changes are made to the image-capture conditions to the extent that the user can recognize an image to be actually generated using a live view images.

In the embodiments, the division unit 74, as shown in FIG. 5, divides the image-capture region 113A of the image sensor 100 into the first to fourth image-capture regions. However, the division unit 74 may divide the image-capture region 113A into two regions, first and second image-capture regions, into three regions, first to third image-capture regions, or into five or more image-capture regions. In this case, display regions in a number corresponding to the number of image-capture regions divided by the division unit 74 are disposed in the image display region of the display unit. For example, if the division unit 74 divides the image-capture region 113A into two image-capture regions, two display regions (first and second display regions) are disposed in the image display region; if it divides the image-capture region 113A into five or more image-capture regions, five or more display regions are disposed in the image display region.

While the sizes (areas) of the first to fourth display regions in the image display region are fixed in the above embodiments, the sizes of the first to fourth display regions in the image display region may be variable in the fifth embodiment. For example, the user takes the first display region between finders and then moves the finders away from each other (pinch-out operation). In response to such an operation, the control unit 71 zooms in the first display region. The control unit 71 then automatically zooms out the second to fourth display regions in accordance with the zoom-in of the first display region. According to this configuration, the user can zoom in a display region (a display region displaying an image of interest) that the user wishes to see most eagerly.

In contrast, the user takes, for example, the first display region between fingers and then bring them into close to each other (pinch-in operation). In response to such an operation, the control unit 71 zooms out the first display region. The control unit 71 then automatically zooms in the second to fourth display regions in accordance with the zoom-out of the first display region. According to this configuration, the user can zoom out a display region displaying an image which the user does not note.

While the control unit 71 zooms in or out a display region in response to an operation of the user in the above embodiments, it may automatically zoom in a display region displaying an image captured under recommended image-capture conditions and automatically zoom out the other display regions in accordance with the size of the zoomed-in display region.

The display units 50, 50A, 50B, 50C, 50D, 50E, and 50F do not need to include a liquid crystal display, which controls display of the pixels by controlling transmission of backlight by applying a voltage and may include an organic electroluminescent liquid crystal display, which controls display of the pixels by controlling spontaneous light emission by applying a voltage.

DESCRIPTION OF REFERENCE SIGNS 1, 1B: digital camera, 1A: image-capture device, 20: image-capture unit, 30, 30A: image processing unit, 31: image generation unit 31, 32: combination unit, 50, 50A, 50C, 50D, 50E, 50F: display unit, 50B: first display unit, 51, 51A, 51C, 51D, 51E, 51F: display surface, 52 (selection unit): touchscreen, 53: second display unit, 70: system control unit, 70A: first system control unit, 70B: second system control unit, 71: control unit, 72: selection unit, 72: setting unit, 73: setting unit, 74: division unit, 100: image sensor

What is claimed:

1. An electronic apparatus comprising:
   an image sensor including a plurality of pixels, each pixel including one of a plurality of photoelectric converters that convert light into charge;
   a display that displays (i) a first image based on the charge accumulated during a first accumulation time in a first photoelectric converter, of the plurality of photoelectric converters, included in at least a first pixel of the plurality of pixels, and (ii) a second image based on the charge accumulated during a second accumulation time longer than the first accumulation time in a second photoelectric converter, of the plurality of photoelectric converters, included in at least a second pixel of the plurality of pixels; and
   a controller that controls a charge accumulation time in the plurality of photoelectric converters included in the plurality of pixels based on an image selected from among the first image and the second image, wherein
   the image sensor includes a pixel region in which the plurality of pixels is arranged side by side in a row direction and a column direction, and
   the second pixel is arranged at a position along the row direction with respect to the first pixel in the pixel region.

2. The electronic apparatus according to claim 1, wherein the image sensor includes:
   a first control line that is connected to the first pixel and receives a control signal for controlling the first accumulation time in the first photoelectric converter; and
   a second control line that is connected to the second pixel and receives a control signal for controlling the second accumulation time in the second photoelectric converter.

3. The electronic apparatus according to claim 2, wherein the first pixel includes a first transferer for transferring the charge accumulated in the first photoelectric converter, and
   the second pixel includes a second transferer for transferring the charge accumulated in the second photoelectric converter.

4. The electronic apparatus according to claim 3, wherein the image sensor includes:
   a third control line that is connected to the first pixel and receives a control signal for controlling the first accumulation time in the first photoelectric converter; and
   a fourth control line that is connected to the second pixel and receives a control signal for controlling the second accumulation time in the second photoelectric converter,
   the first pixel includes a first resetter that is connected to the third control line and discharges the charge accumulated in the first photoelectric converter, and
   the second pixel includes a second resetter that is connected to the fourth control line and discharges the charge accumulated in the second photoelectric converter.

5. The electronic apparatus according to claim 2, wherein the first pixel includes a first resetter that is connected to the first control line and discharges the charge accumulated in the first photoelectric converter, and
   the second pixel includes a second resetter that is connected to the second control line and discharges the charge accumulated in the second photoelectric converter.

6. The electronic apparatus according to claim 1, wherein the image sensor further includes:
   a first converter that converts a first signal based on the charge accumulated in the first photoelectric converter into a digital signal; and
   a second converter that converts a second signal based on the charge accumulated in the second photoelectric converter into a digital signal,
   the first image is generated based on the first signal converted into the digital signal by the first converter, and the second image is generated based on the second signal converted into the digital signal by the second converter.

7. The electronic apparatus according to claim 6, wherein the image sensor further includes:
   a first chip in which the first photoelectric converter and the second photoelectric converter are arranged; and
   a second chip in which the first converter and the second converter are arranged.

8. The electronic apparatus according to claim 7, wherein the first chip has a first surface on which light from an optical system is incident and a second surface opposite to the first surface, and
the second chip is arranged on a side of the second surface of the first chip.

9. The electronic apparatus according to claim 1, wherein the image sensor further includes:
   a first converter that converts a first signal based on the charge accumulated in the first photoelectric converter into a first digital signal;
   a second converter that converts a second signal based on the charge accumulated in the second photoelectric converter into a second digital signal;
   a first recorder that records the first digital signal converted by the first converter; and
   a second recorder that records the second digital signal converted by the second converter,
   the first image is generated based on the first digital signal recorded by the first recorder, and
   the second image is generated based on the second digital signal recorded by the second converter.

10. The electronic apparatus according to claim 9, wherein
the image sensor further includes:
   a first chip in which at least the first photoelectric converter and the second photoelectric converter are arranged;
   a second chip in which at least the first converter and the second converter are arranged; and
   a third chip in which at least the first recorder and the second recorder are arranged.

11. The electronic apparatus according to claim 10, wherein
the first chip has a first surface on which light from an optical system is incident and a second surface opposite to the first surface, and
the third chip is arranged on a side of the second surface of the first chip.

12. The electronic apparatus according to claim 11, wherein
the second chip is arranged between the first chip and the third chip in an optical axis direction of the optical system.

* * * * *